United States Patent
Lin et al.

(10) Patent No.: US 10,134,863 B2
(45) Date of Patent: Nov. 20, 2018

(54) VERTICAL SEMICONDUCTOR DEVICE STRUCTURE AND METHOD OF FORMING

(71) Applicant: Taiwan Semiconductor Manufacturing Company, Ltd., Hsin-Chu (TW)

(72) Inventors: Yi-Hsiung Lin, Hsin-Chu (TW); Yi-Hsun Chiu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 14/739,450

(22) Filed: Jun. 15, 2015

(65) Prior Publication Data

US 2016/0365439 A1    Dec. 15, 2016

(51) Int. Cl.
| | |
|---|---|
| H01L 29/78 | (2006.01) |
| H01L 29/423 | (2006.01) |
| H01L 29/66 | (2006.01) |
| H01L 29/778 | (2006.01) |
| H01L 29/786 | (2006.01) |
| H01L 29/45 | (2006.01) |
| H01L 29/775 | (2006.01) |
| H01L 29/10 | (2006.01) |

(52) U.S. Cl.
CPC .. *H01L 29/42392* (2013.01); *H01L 29/66666* (2013.01); *H01L 29/7788* (2013.01); *H01L 29/7827* (2013.01); *H01L 29/78642* (2013.01); *H01L 29/1083* (2013.01); *H01L 29/456* (2013.01); *H01L 29/775* (2013.01)

(58) Field of Classification Search
CPC .................................................... H01L 29/78
USPC ............................................................ 257/329
See application file for complete search history.

(56) References Cited

U.S. PATENT DOCUMENTS

| | | | |
|---|---|---|---|
| 8,884,340 B2 | 11/2014 | Kim et al. | |
| 2008/0173911 A1* | 7/2008 | Hirata | H01L 27/14603 257/292 |
| 2011/0115011 A1* | 5/2011 | Masuoka | H01L 21/823431 257/314 |
| 2011/0303973 A1* | 12/2011 | Masuoka | H01L 21/823885 257/329 |
| 2014/0131769 A1 | 5/2014 | Park et al. | |
| 2015/0137067 A1 | 5/2015 | Colinge et al. | |
| 2015/0179788 A1 | 6/2015 | Teramoto | |

FOREIGN PATENT DOCUMENTS

| | | |
|---|---|---|
| KR | 101431774 B1 | 8/2014 |
| KR | 20150039876 A | 4/2015 |
| KR | 20150057962 A | 5/2015 |
| TW | 201248857 A | 12/2012 |

* cited by examiner

*Primary Examiner* — Matthew Reames
*Assistant Examiner* — Christopher Culbert
(74) *Attorney, Agent, or Firm* — Slater Matsil, LLP

(57) ABSTRACT

Vertical gate all-around (VGAA) structures are described. In an embodiment, a structure including a first doped region in a substrate, a first vertical channel extending from the first doped region, a first metal-semiconductor compound region in a top surface of the first doped region, the first metal-semiconductor compound region extending along at least two sides of the first vertical channel, and a first gate electrode around the first vertical channel.

20 Claims, 31 Drawing Sheets

VERTICAL SEMICONDUCTOR DEVICE STRUCTURE AND METHOD OF FORMING

BACKGROUND

Transistors are key components of modern integrated circuits. To satisfy the desires of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having gate-all-around structures were also developed, wherein the respective transistors are also referred to as gate all around transistors. In a gate all around transistor, a gate dielectric and a gate electrode fully encircle the channel region. This configuration delivers a good control of the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
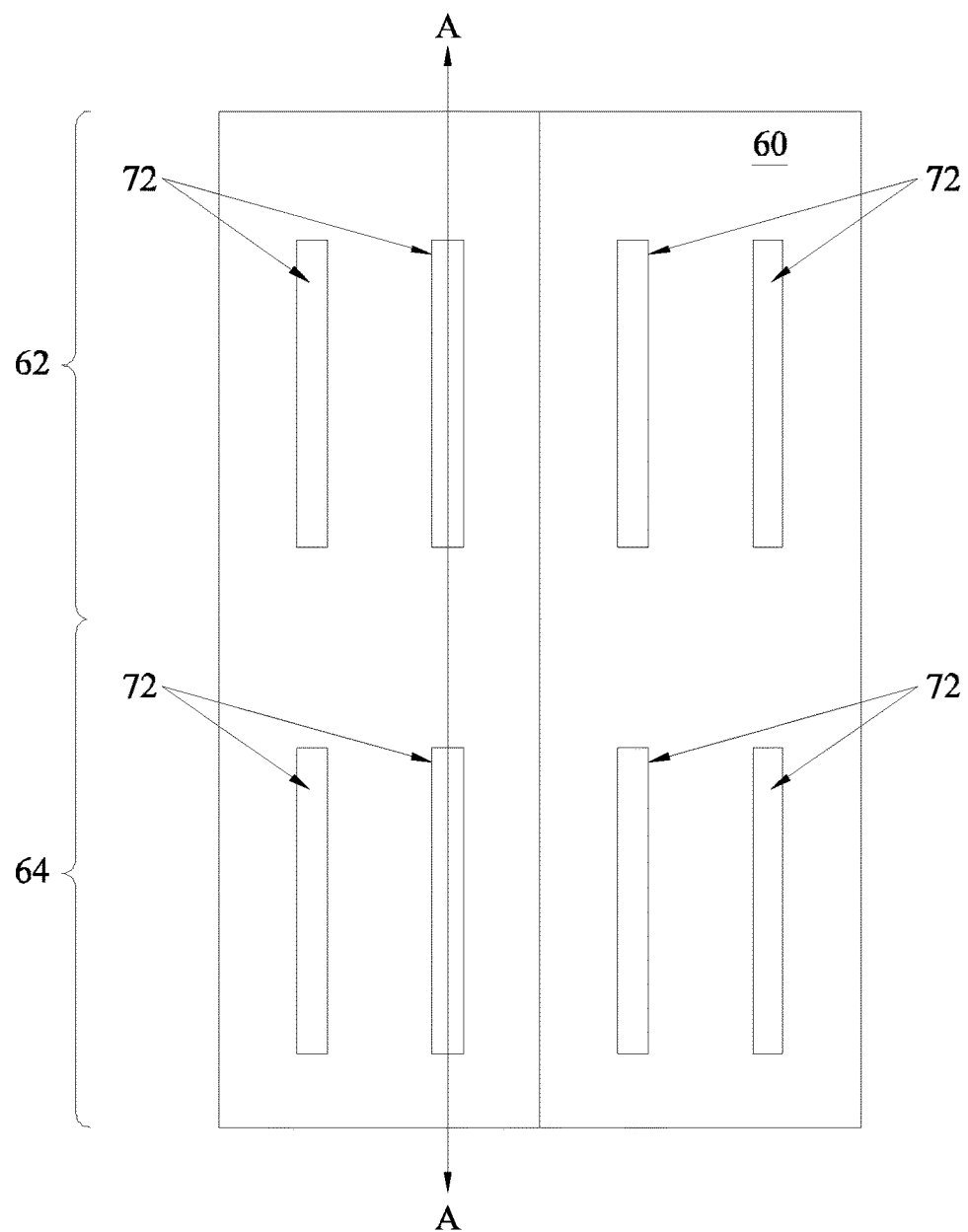
FIG. 1 is a plan view of Vertical Gate-All-Around (VGAA) device structures at an intermediate step in processing in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Vertical Gate-All-Around (VGAA) devices with various device and metal-semiconductor compound (sometimes referred to as silicide) configurations are provided in accordance with various example embodiments. Some variations of the embodiments are discussed. Throughout the various views and illustrative embodiments, like reference numbers are used to designate like elements. Further, method embodiments discussed herein may be discussed as being performed in a particular order; however, other method embodiments may be performed in any logical order.

FIG. 1 illustrates a plan view of VGAA device structures at an intermediate step in processing in accordance with some embodiments. The device includes a substrate 60 including a first region 62 for forming a first device type, e.g., n-type, and a second region 64 for forming a second device type, e.g., p-type. The regions 62 and 64 include vertical channel structures 72. In some embodiments, the vertical channel structures 72 are referred to as nanobars, although other vertical channel structure shapes and configurations are possible, such as nanowires, multiple nanowires, multiple nanobars, or the like. In some embodiments, the vertical channel structures 72 are formed in pairs in the regions 62 and 64, and each pair of vertical channel structures 72 have a single gate electrode surrounding sides of both of the vertical channel structures 72 in the pair.

FIGS. 2 through 22 illustrate cross sectional views of intermediate steps during a process for forming VGAA device structures in accordance with some embodiments. The various views are not necessarily representative of a cross section or layout of the device and metal-semiconductor compound configurations discussed below in FIGS. 23A through 28B. The cross sectional views of FIGS. 2 through 24A and plan view of FIG. 1, and a method discussed in the context of these views, are provided to illustrate aspects of VGAA device structures and how they are formed and to provide a reference for features discussed with respect to subsequent plan views and configurations. One of ordinary skill in the art will readily understand how to apply the discussion of FIGS. 1 through 22 to the plan views discussed subsequently.

Figure 2:
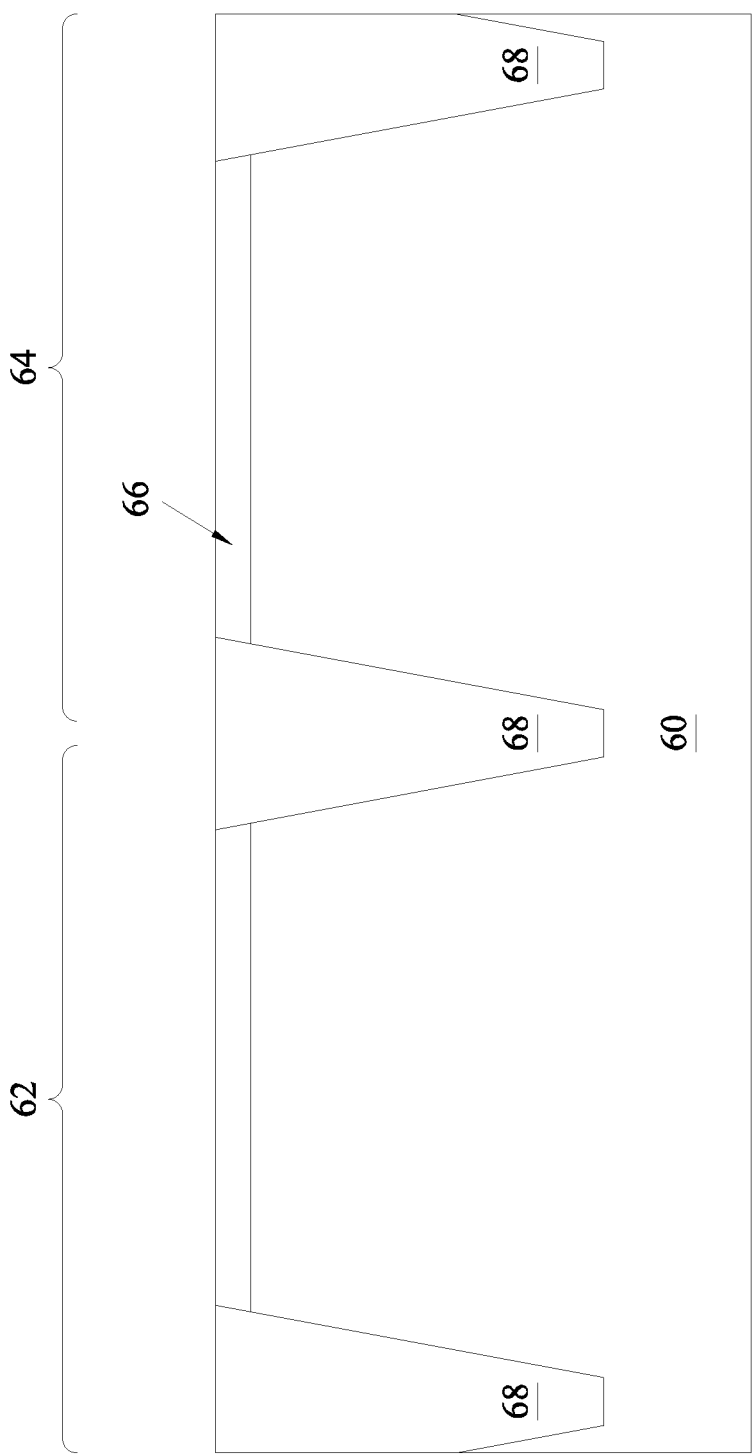
FIGS. 2 through 22 are cross sectional views of intermediate steps during a process for forming VGAA device structures in accordance with some embodiments.

FIG. 2 illustrates a substrate 60 with a mask layer 66 and isolation regions 68. The substrate 60 can be a bulk semiconductor substrate, a semiconductor-on-insulator (SOI) substrate, a multi-layered or gradient substrate, or the like. The semiconductor of the substrate 60 may include any semiconductor material, such as elemental semiconductor like silicon, germanium, or the like; a compound or alloy semiconductor including SiC, SiP, SiPC, GaAs, GaP, InP, InAs, indium antimonide, SiGe, GaAsP, AlInAs, AlGaAs, GaInAs, GaInP, and/or GaInAsP; the like; or a combinations thereof. The substrate 60 may further be a wafer, for example, which may further be a silicon wafer. The substrate 60 comprises a first region 62 for forming a first device type, e.g., n-type, and a second region 64 for forming a second device type, e.g., p-type.

The mask layer 66, such as a hardmask, is deposited on the substrate 60. The mask layer 66 may be formed of, for example, silicon nitride, silicon carbide, silicon oxynitride, silicon carbon nitride, or the like, and may be formed using Chemical Vapor Deposition (CVD), Plasma-Enhanced CVD (PECVD), Atomic Layer Deposition (ALD), or the like. The mask layer 66 is then patterned to expose the substrate 60, and recesses, or trenches, are etched in the substrate 60. The patterning and etching may use an acceptable photolithography and etching process, such as Reactive Ion Etching (RIE) or the like.

The recesses in the substrate 60 are then filled with a dielectric material to form the isolation regions 68. The isolation regions 68 may be referred to as Shallow Trench Isolation (STI) regions. The isolation regions 68 may be formed of silicon oxide deposited by a high density plasma, for example, although other dielectric materials formed according to various techniques may also be used. A planarization process, such as a Chemical Mechanical Polish (CMP), may be performed to remove excess dielectric material and form the top surface of the isolation regions 68 to be coplanar with the top surface of the mask layer 66. In other embodiments, the isolation regions can be formed by thermal oxidation to grow a dielectric material, such as silicon oxide.

Figure 3:
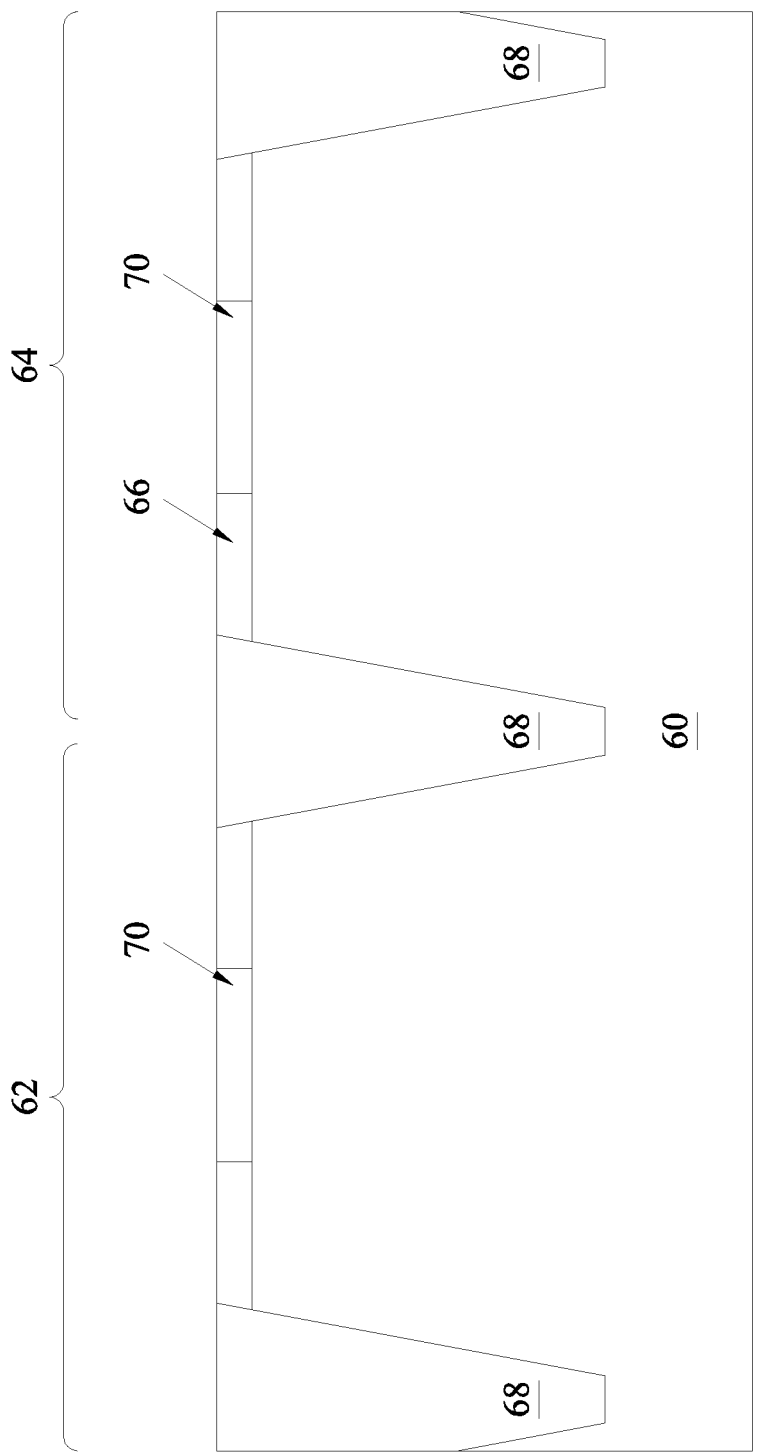

In FIG. 3, the mask layer 66 is patterned with openings corresponding to channel structures that are to be formed, and a mask cap 70 is formed in each opening in the mask layer 66. The mask layer 66 may be patterned using an acceptable photolithography and etching process, such as RIE or the like. The mask caps 70 can be formed by depositing a material with a different etch selectivity than the mask layer 66 in the openings and on the mask layer 66. The material of the mask cap 70 may be, for example, silicon nitride, silicon carbide, silicon oxynitride, silicon carbon nitride, or the like, and may be formed using CVD, PECVD, ALD, or the like. The material of the mask cap 70 may then be planarized, such as by a CMP, to form the mask caps 70 with top surfaces coplanar with the top surface of the mask layer 66.

Figure 4:
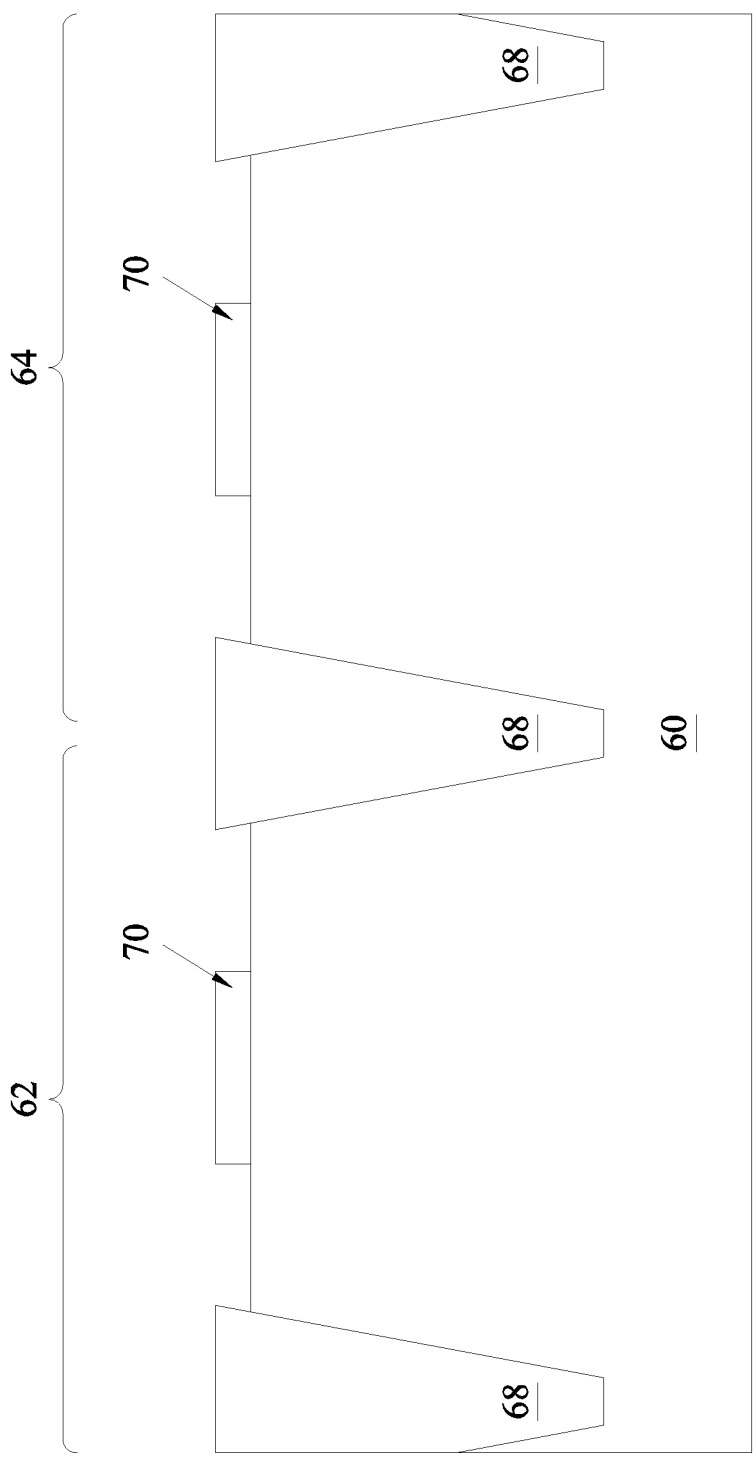
Figure 5:
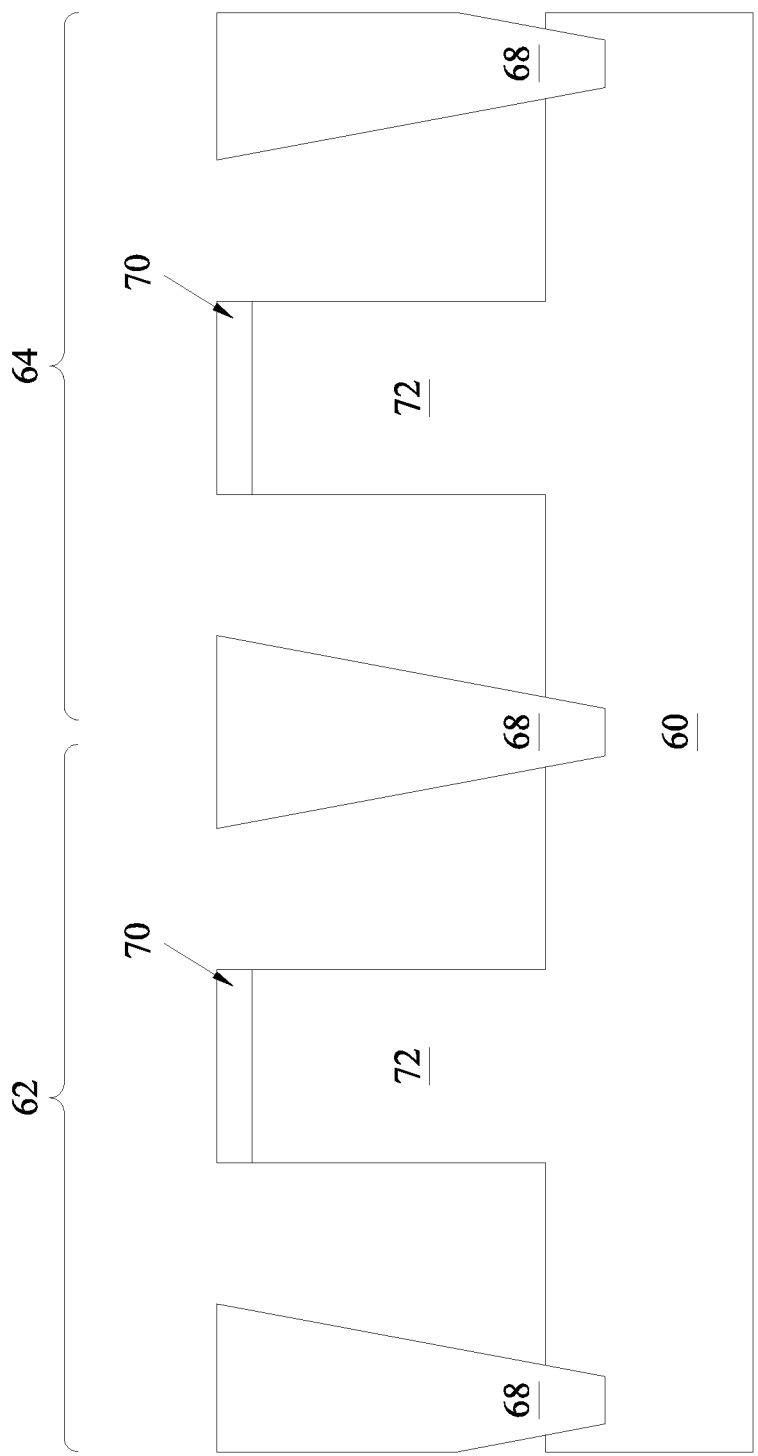

In FIG. 4, the mask layer 66 is removed, such as by an appropriate etch selective to the mask layer 66. In FIG. 5, vertical channel structures 72 are formed from the substrate 60. Using the mask caps 70 as a mask, the substrate 60 is recessed, such as by using an appropriate anisotropic etch such as RIE or the like, to form the vertical channel structures 72. The vertical channel structures 72 can have cross sections in a plane parallel to a top surface of the substrate 60 that are circles, squares, rectangles, ovals, ellipses, or the like. The vertical channel structures 72 may be referred to as nanobars. Although one vertical channel structure 72 is depicted for each transistor or device that is formed in the process discussed herein, each transistor or device can comprise multiple vertical channel structures, which can have any appropriate shape or combination of shapes. In other embodiments, the vertical channel structures 72 can include epitaxially growing the vertical channel structures 72. The epitaxial growth can use Ge, SiGe, SiC, SiP, SiPC, a III-V material, the like, or a combination thereof. Example III-V materials include InP, InAs, GaAs, AlInAs, InGaP, InGaAs, GaAsSb, GaPN, and AlPN.

Figure 6:
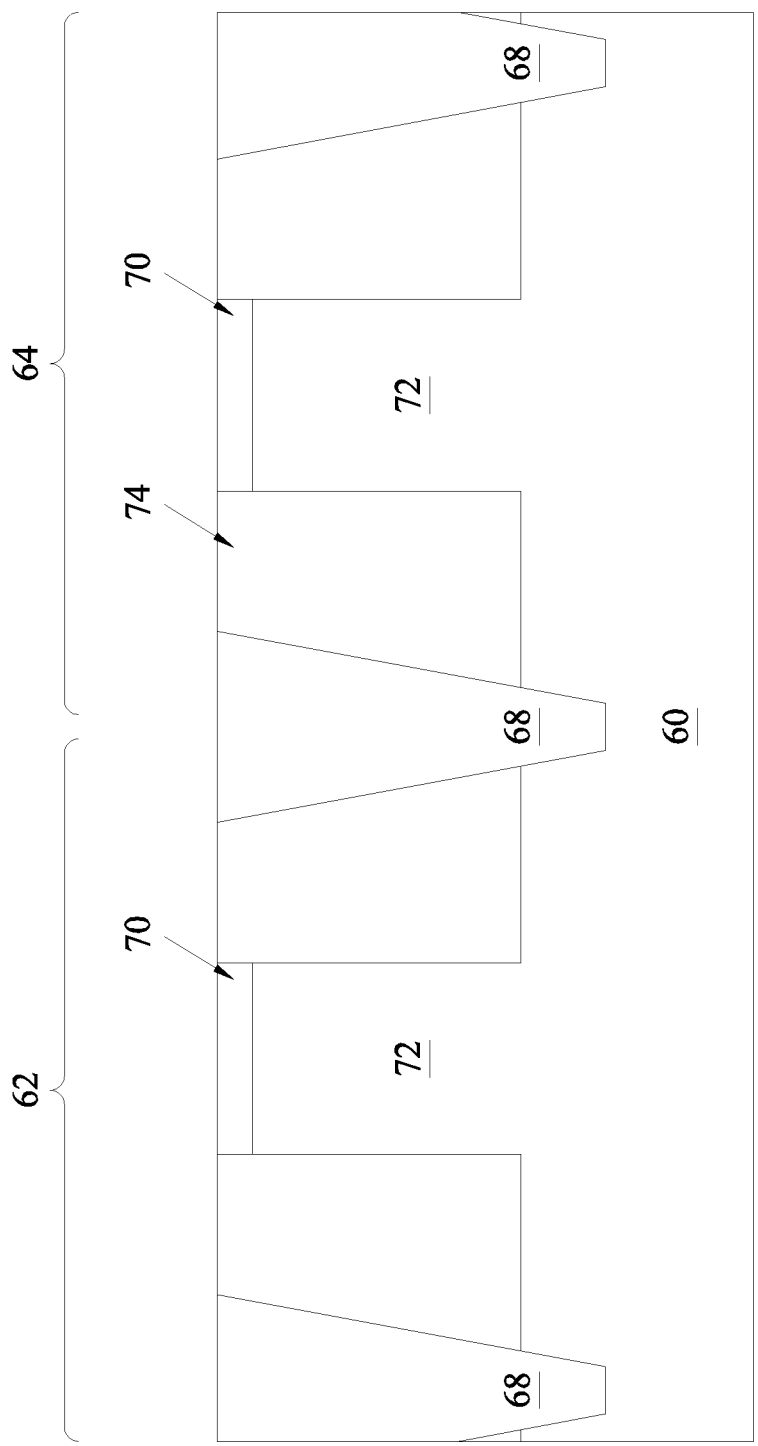
Figure 7:
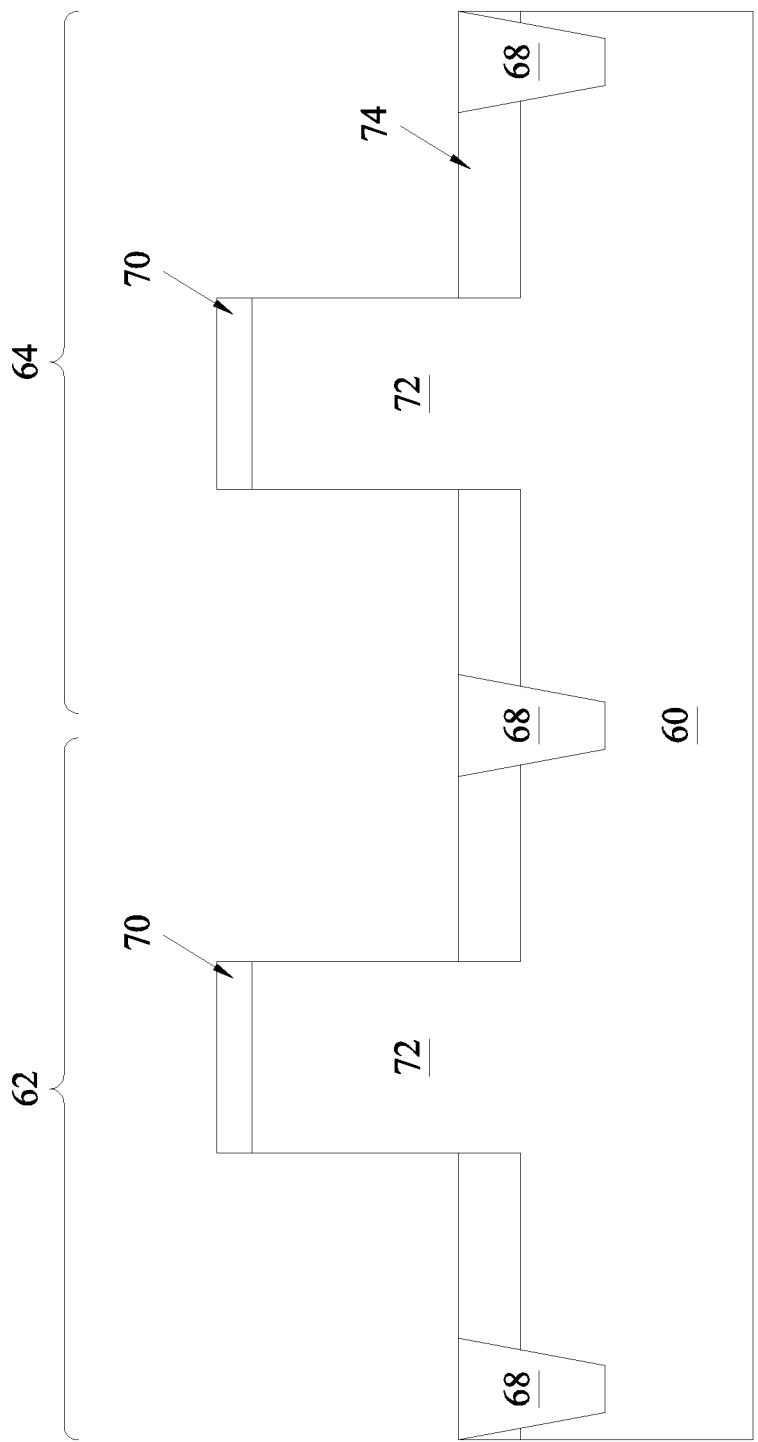

In FIG. 6, a filler dielectric layer 74 is formed on the substrate 60 and around the vertical channel structures 72. In some embodiments, the filler dielectric layer 74 is an oxide formed by a flowable CVD (FCVD) (e.g., a CVD-based material deposition in a remote plasma system) and a post curing, such as an anneal. In other embodiments, the filler dielectric layer 74 can be formed by another deposition technique, such as CVD, PECVD, the like, or a combination thereof, and can be a dielectric material such as silicon oxide, phosphosilicate glass (PSG), borosilicate glass (BSG), borophosphosilicate glass (BPSG), un-doped silicate glass (USG), a nitride, oxynitride, or the like. After deposition of the filler dielectric layer 74, a CMP may be performed to planarize the filler dielectric layer 74 to have a top surface coplanar with top surface of the mask caps 70 and isolation regions 68. In FIG. 7, the filler dielectric layer 74 and the isolation regions 68 are etched back, such as by using an appropriate etch, such as RIE or the like, such that the vertical channel structures 72 protrude from the filler dielectric layer 74.

Figure 8:
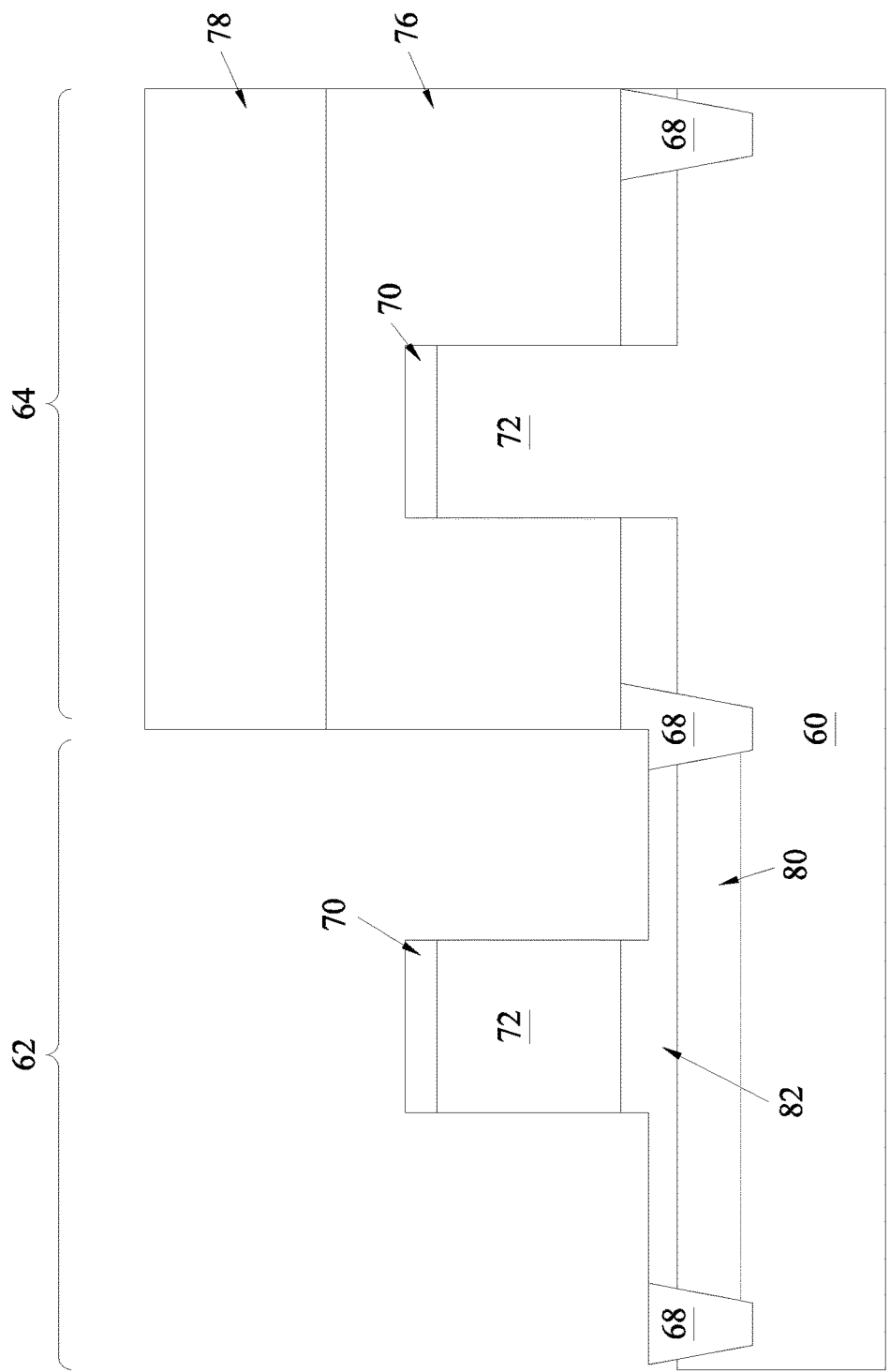

In FIG. 8, a bottom layer 76 and a photoresist 78 are formed on the second region 64 of the substrate 60. The bottom layer 76 may comprise a hard mask material such as silicon nitride, silicon carbide, silicon oxynitride, silicon carbon nitride, or the like formed by using CVD, PECVD, ALD, or the like. The bottom layer 76 may be planarized, such as by CMP. The bottom layer 76 can be initially formed in the first region 62 and the second region 64 of the substrate 60. The photoresist 78 is then formed and patterned on the bottom layer 76 in the second region 64. The photoresist 78 can be formed by using a spin-on technique and patterned using acceptable photolithography techniques. The portion of the bottom layer 76 in the first region 62 can then be removed, such as by etching, such as RIE or the like, using the photoresist 78 as a mask. The filler dielectric layer 74 can be removed from the first region 62 of the substrate 60 after the bottom layer 76 is removed. The bottom layer 76 can remain in the second region 64 of the substrate 60 while exposing the first region 62 of the substrate 60.

Once the bottom layer 76 and the photoresist 78 are formed, a p-type dopant is implanted in the first region 62 of the substrate 60 to form a p-doped well 80. Example species for implanting p-type dopants include boron (B), $BF_2$, indium (In), nitrogen (N), carbon (C), the like, or a combination thereof. A concentration of a p-type dopant in the p-doped well 80 can be in a range from about $1\times10^{17}$ cm$^{-3}$ to about $5\times10^{19}$ cm$^{-3}$. Then, an n-type dopant is implanted in the p-doped well 80 in the first region 62 of the substrate 60 to form an n+-doped source/drain region 82. Example species for implanting n-type dopants include arsenic (As), phosphorus (P), antimony (Sb), nitrogen (N), carbon (C), the like, or a combination thereof. A concentration of an n-type dopant in the n+-doped source/drain region 82 can be in a range from about $1\times10^{20}$ cm$^{-3}$ to about $7\times10^{21}$ cm$^{-3}$. The bottom layer 76 and the photoresist 78 can then be removed, such by as an appropriate ashing to remove the photoresist 78 and an etching to remove the bottom layer 76.

Figure 9:
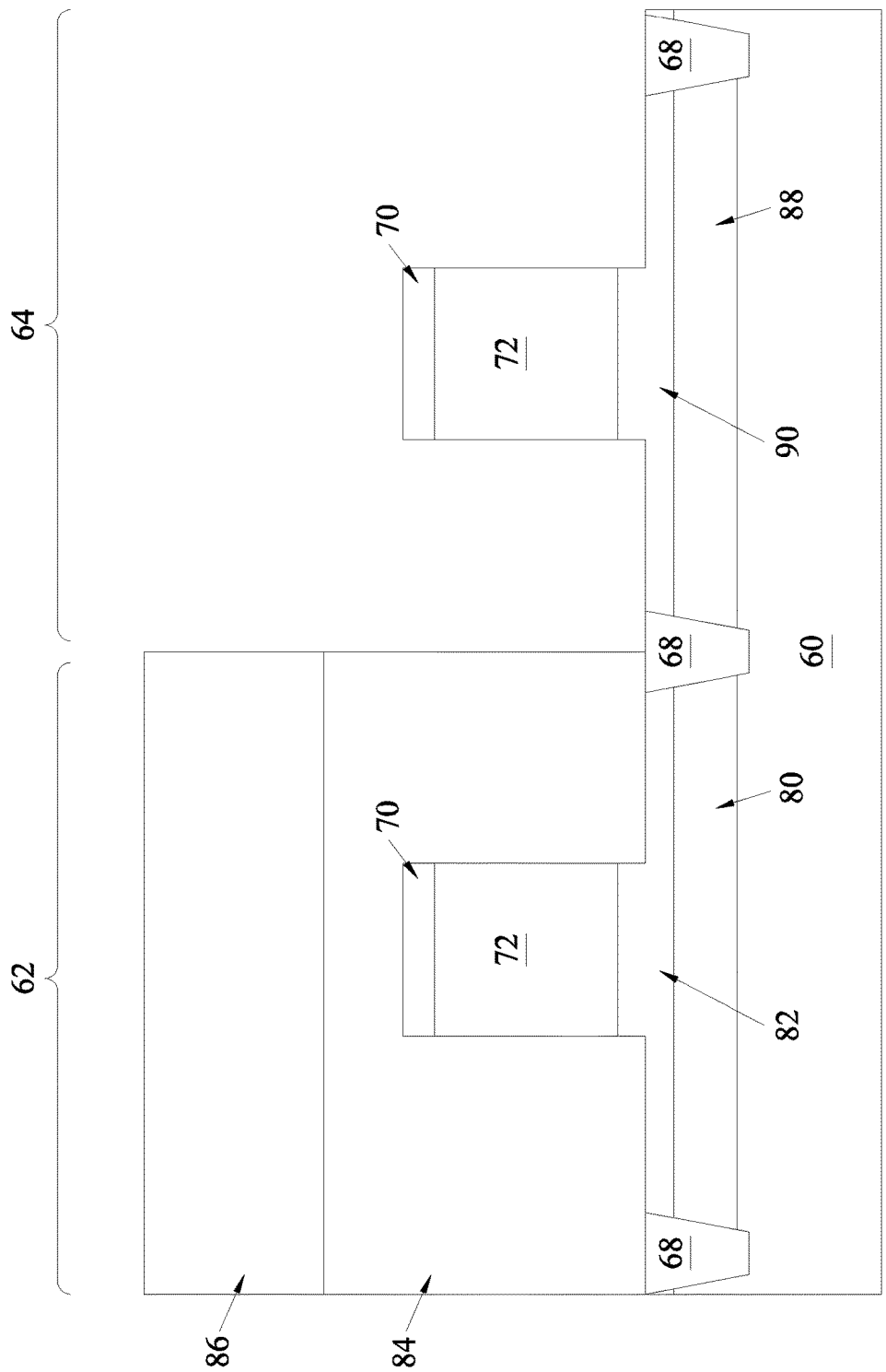

In FIG. 9, a bottom layer 84 and a photoresist 86 are formed on the first region 62 of the substrate 60. The bottom layer 84 may comprise a hard mask material such as silicon nitride, silicon carbide, silicon oxynitride, silicon carbon nitride, or the like formed by using CVD, PECVD, ALD, or the like. The bottom layer 84 may be planarized, such as by CMP. The bottom layer 84 can be initially formed in the first region 62 and the second region 64 of the substrate 60. The photoresist 86 is then formed and patterned on the bottom layer 84 in the second region 64. The photoresist 86 can be formed by using a spin-on technique and patterned using acceptable photolithography techniques. The portion of the bottom layer 84 in the second region 64 can then be removed, such as by etching, such as RIE or the like, using the photoresist 86 as a mask. The filler dielectric layer 74 can be removed from the second region 64 of the substrate 60 after the bottom layer 84 is removed. The bottom layer 84 can remain in the first region 62 of the substrate 60 while exposing the second region 64 of the substrate 60.

Once the bottom layer 84 and the photoresist 86 are formed, an n-type dopant is implanted in the second region 64 of the substrate 60 to form an n-doped well 88. Example species for implanting n-type dopants include arsenic (As), phosphorus (P), antimony (Sb), nitrogen (N), carbon (C), the like, or a combination thereof. A concentration of an n-type dopant in the n-doped well 88 can be in a range from about $1 \times 10^{17}$ cm$^{-3}$ to about $5 \times 10^{19}$ cm$^{-3}$. Then, a p-type dopant is implanted in the n-doped well 88 in the second region 64 of the substrate 60 to form a p+-doped source/drain region 90. Example species for implanting p-type dopants include boron (B), BF$_2$, indium (In), nitrogen (N), carbon (C), the like, or a combination thereof. A concentration of a p-type dopant in the p+-doped source/drain region 90 can be in a range from about $5 \times 10^{19}$ cm$^{-3}$ to about $5 \times 10^{21}$ cm$^{-3}$. The bottom layer 84 and the photoresist 86 can then be removed, such by as an appropriate ashing to remove the photoresist 86 and an etching to remove the bottom layer 84.

Figure 10:
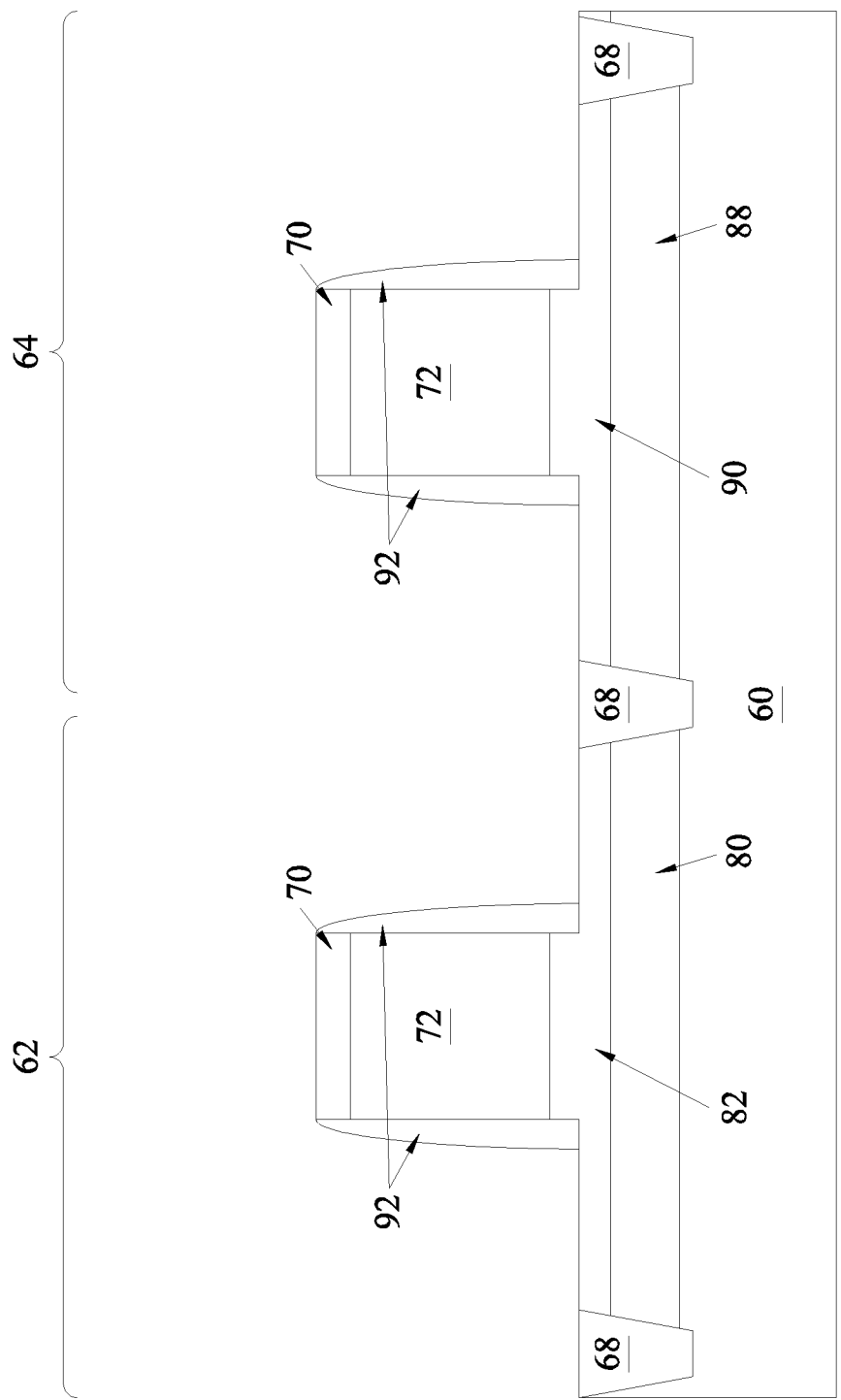

In FIG. 10, spacers 92 are formed around sidewalls of the vertical channel structures 72. In some embodiments, a spacer layer is conformally deposited over the substrate 60 and along the sidewalls of the vertical channel structures 72 such that the thickness of the spacer layer is substantially a same thickness throughout the layer. In some embodiments, the spacer layer is made of SiN, SiON, SiC, SiCN, SiOCN, the like, or a combination thereof. The spacer layer may be deposited using an appropriate deposition process, such as ALD, CVD, PVD, the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the spacers 92 around and along the sidewalls of the vertical channel structures 72.

Figure 11:
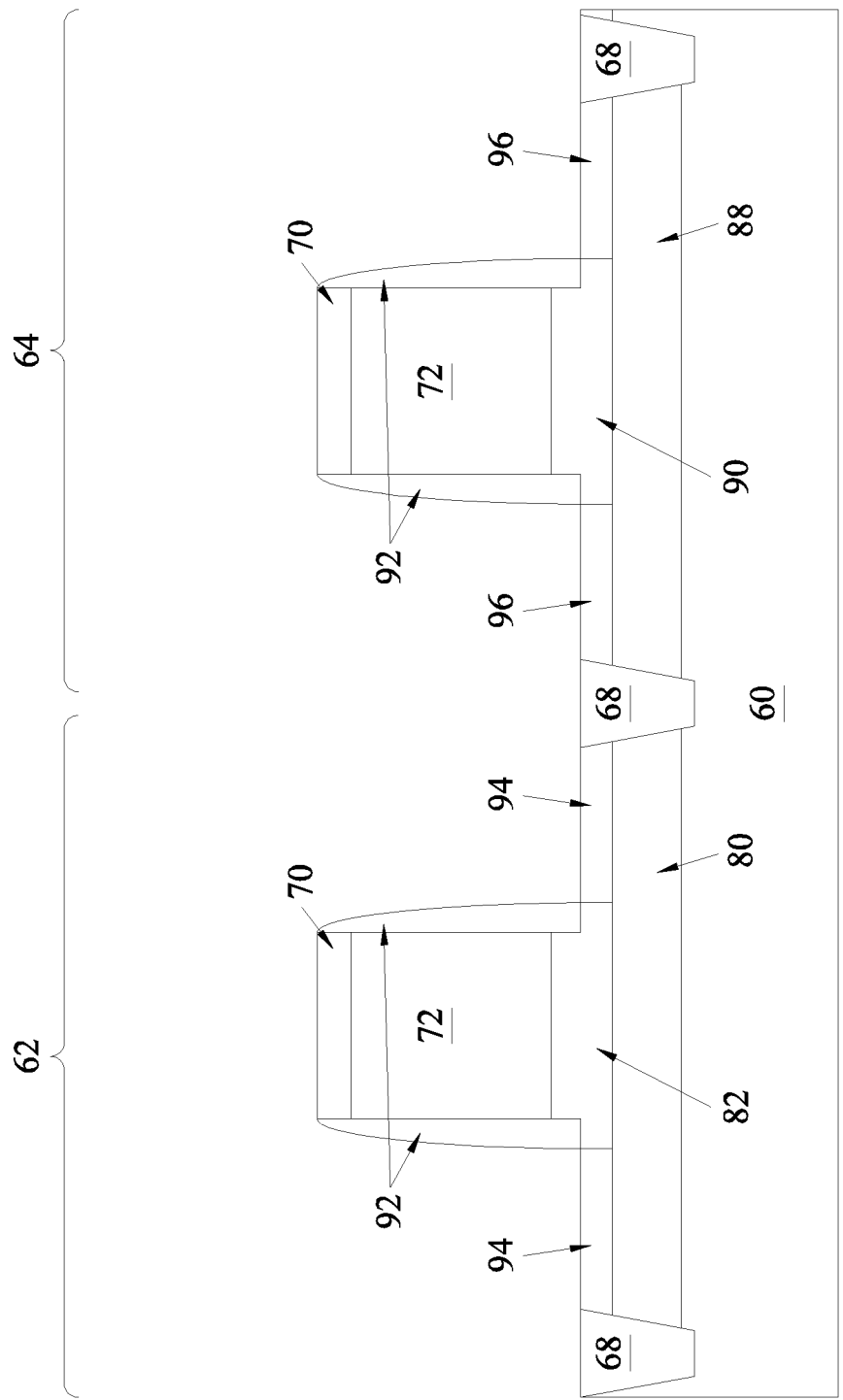

In FIG. 11, a metal-semiconductor compound region 94 in the first region 62 and a metal-semiconductor compound region 96 in the second region 64 are formed. The metal-semiconductor compound regions 94 and 96 can be formed by depositing a metal on the substrate 60 and reacting the metal with a semiconductor, such as the semiconductor material of the substrate 60. In some embodiments, the metal can include cobalt, titanium, nickel, tungsten, the like, or a combination thereof, and can be deposited by Physical Vapor Deposition (PVD), ALD, CVD, the like, or a combination thereof. The metal can be caused to react with the semiconductor by using an anneal (sometimes referred as a salicidation step). Any unreacted metal that remains after the anneal can be removed using an etch selective to the material of the unreacted metal, such as an etch including NH$_4$OH or the like. In some embodiments, the anneal process is performed in multiple annealing steps. For example, a first annealing step is performed at a first temperature in a range from about 200° C. to about 500° C., and a second annealing step is performed at a second temperature in a range from about 500° C. to about 950° C. The metal-semiconductor compound regions 94 and 96 can include CoSi, CoNiSi, TiSi, NiSi, WSi, the like, or a combination thereof.

Figure 12:
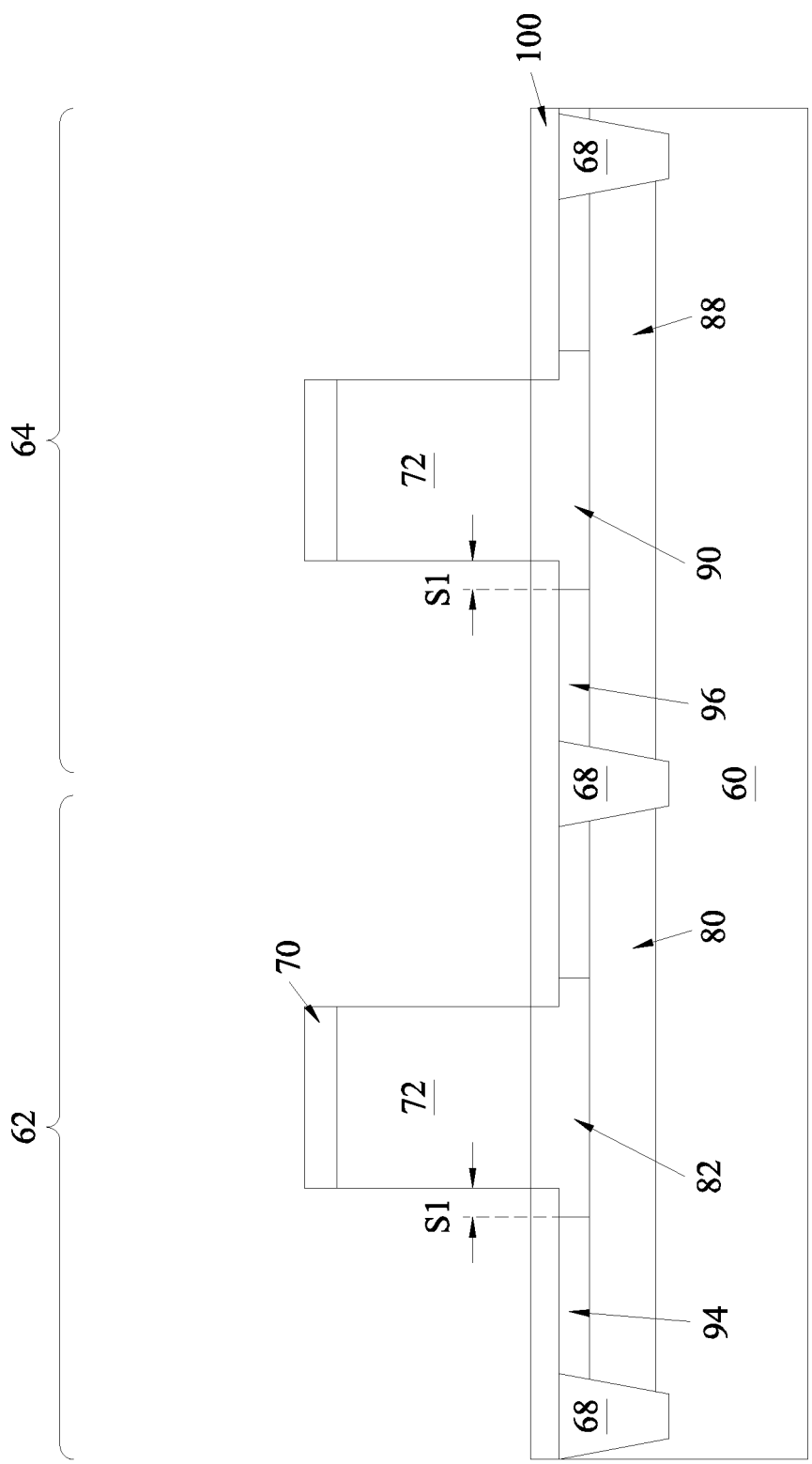

The spacers 92 and mask caps 70 prevent the metal from reacting with the semiconductor material of the vertical channel structures 72 during the anneal. The metal-semiconductor compound regions 94 and 96 are formed on the exposed portions of semiconductor material of the substrate 60 in the first region 62 and the second region 64. As illustrated, the metal-semiconductor compound regions 94 and 96 are formed in, and consume, the entireties of the exposed portions of source/drain regions 82 and 90, respectively, that are not under or protected by the spacers 92. In other embodiments, the metal-semiconductor compound regions 94 and 96 can be formed to a greater or lesser extent in the substrate 60. In some embodiments, the metal-semiconductor compound regions 94 and 96 completely surround the respective vertical channel structure(s) 72. In some other embodiments, the metal-semiconductor compound regions 94 and 96 partially surround the respective vertical channel structure(s) 72. In some embodiments, the spacers 92 are omitted and the metal-semiconductor compound regions 94 and 96 may be nearer to the vertical channel structures 72 or even undercut the vertical channel structures 72. In FIG. 12, the spacers 92 are removed and a first dielectric layer 100 are formed over the metal-semiconductor compound regions 94 and 96 and the isolation regions 68. The metal-semiconductor compound regions 94 and 96 may be spaced from sidewalls of the vertical channel structures 72 by a spacing S1. In some embodiments, the spacing S1 is in a range from about −3 nm to about 20 nm. In other words, the metal-semiconductor compound regions 94 and 96 could undercut the sidewalls of the vertical channel structures 72 by up to about 3 nm (hence, the lower limit spacing S1 being about −3 nm) or be spaced from the sidewalls by up to 20 nm. In some embodiments, the spacing S1 is less than 10 nm.

In other embodiments, other conductive features can be used instead of or in combination with the metal-semiconductor compound regions 94 and 96. For example, in the first region 62, an epitaxially grown material may be used, such as SiP, SiC, SiPC, Si, Ge, a III-V material, a combination thereof, or the like. For example, in the second region 64, an epitaxially grown material may be used, such as SiGe, Ge, a Ge-containing material, SiP, SiC, a III-V material, a combination thereof, or the like.

Although not illustrated, channel implants may be performed to dope the vertical channel structures 72. The implantation process may include masking regions, such as discussed above with respect to FIGS. 8 and 9. An n-type dopant can be implanted in the vertical channel structure 72 in the second region 64 of the substrate 60 to form an n-doped channel. Example species for implanting n-type dopants include arsenic (As), phosphorus (P), antimony (Sb), germanium (Ge), nitrogen (N), carbon (C), the like, or a combination thereof. A concentration of an n-type dopant in the n-doped channel can be in a range from about $1 \times 10^{12}$ cm$^{-3}$ to about $5 \times 10^{13}$ cm$^{-3}$. A p-type dopant can be implanted in the vertical channel structure 72 in the first region 62 of the substrate 60 to form a p-doped channel. Example species for implanting p-type dopants include boron (B), BF$_2$, indium (In), germanium (Ge), nitrogen (N), carbon (C), the like, or a combination thereof. A concentration of a p-type dopant in the p-doped channel can be in a range from about $1\times10^{12}$ cm$^{-3}$ to about $5\times10^{13}$ cm$^{-3}$.

Figure 13:
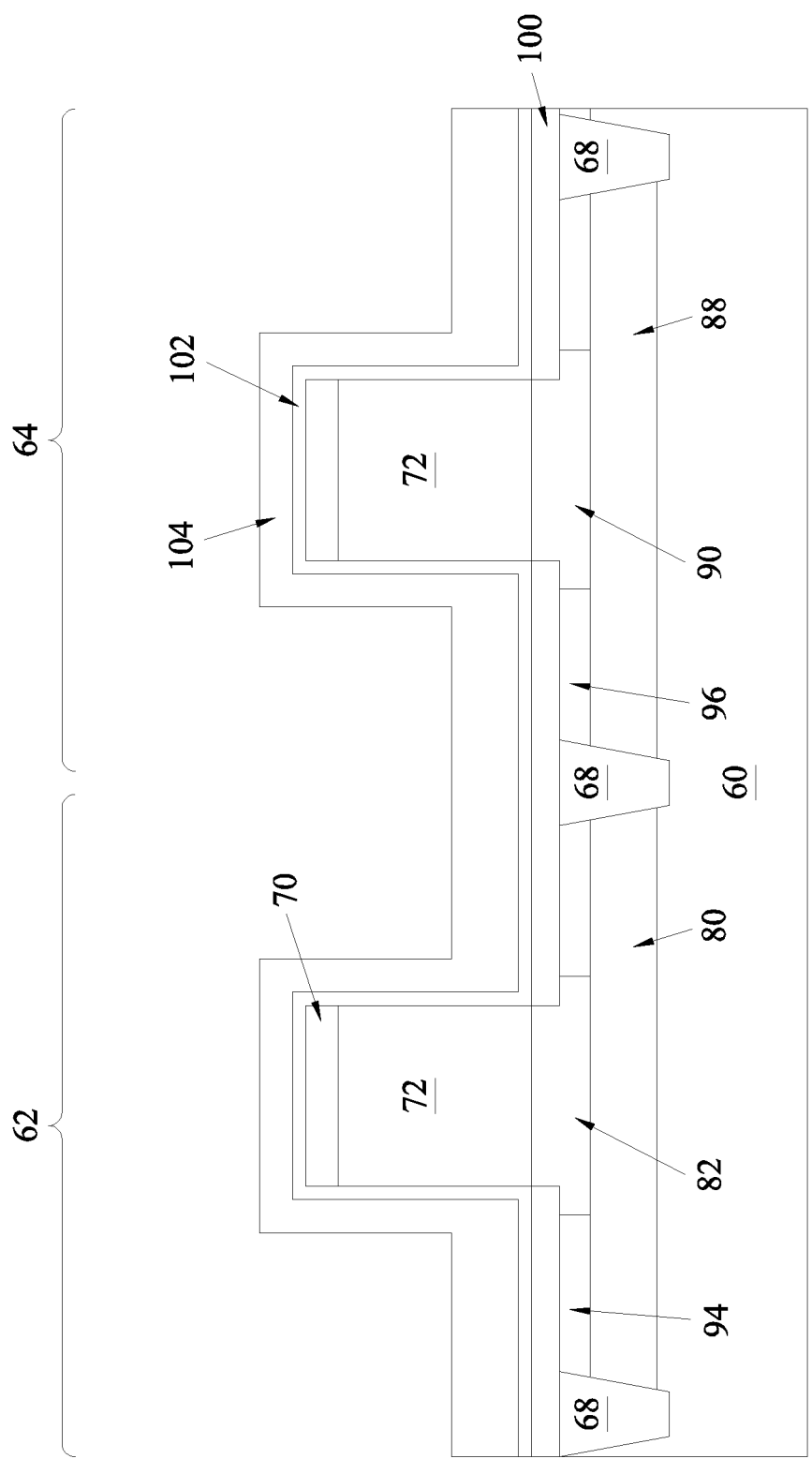
Figure 14:
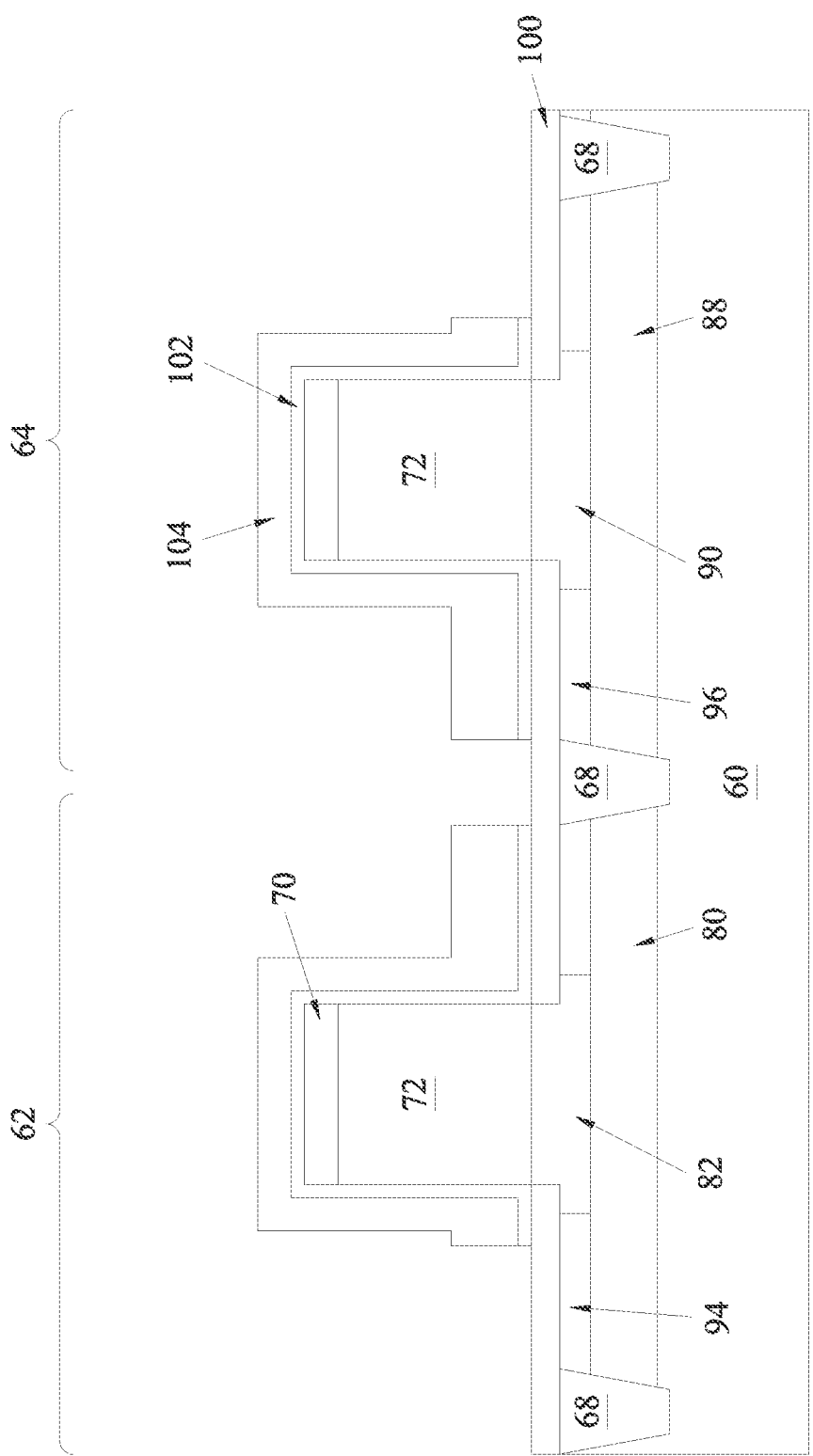

In FIG. 13, gate dielectric layer 102 and gate electrode layer 104 are formed. Gate dielectric layer 102 is deposited conformally on the vertical channel structures 72, such as over the top surfaces of the mask caps 70 and along the sidewalls of the vertical channel structures 72. In accordance with some embodiments, gate dielectric layer 102 comprises silicon oxide, silicon nitride, or multilayers thereof. In other embodiments, gate dielectric layer 102 comprises a high-k dielectric material, and in these embodiments, gate dielectric layer 102 may have a k value greater than about 7.0, or further, greater than about 10.0. A high-k dielectric material may include SiON, $Si_3N_4$, $Ta_2O_5$, $Al_2O_3$, a Hf oxide, a Ta oxide, an Al oxide, the like, and a combination thereof. The formation methods of gate dielectric layer 102 may include Molecular Beam Deposition (MBD), ALD, PECVD, the like, or a combination thereof. Next, gate electrode layer 104 is deposited over gate dielectric layer 102. The gate electrode layer 104 may comprise a metal-containing material such as TiN, TaN, TiAl, TaAl, a Ti-containing material, a Ta-containing material, an Al-containing material, a W-containing material, TiSi, NiSi, PtSi, polysilicon with a silicide, a Cu-containing material, a refractory material, the like, combinations thereof, or multi-layers thereof. In FIG. 14, the gate electrode layer 104 and the gate dielectric layer 102 are patterned, such as by using an acceptable photolithography and etching process, such as RIE or the like.

Figure 15:
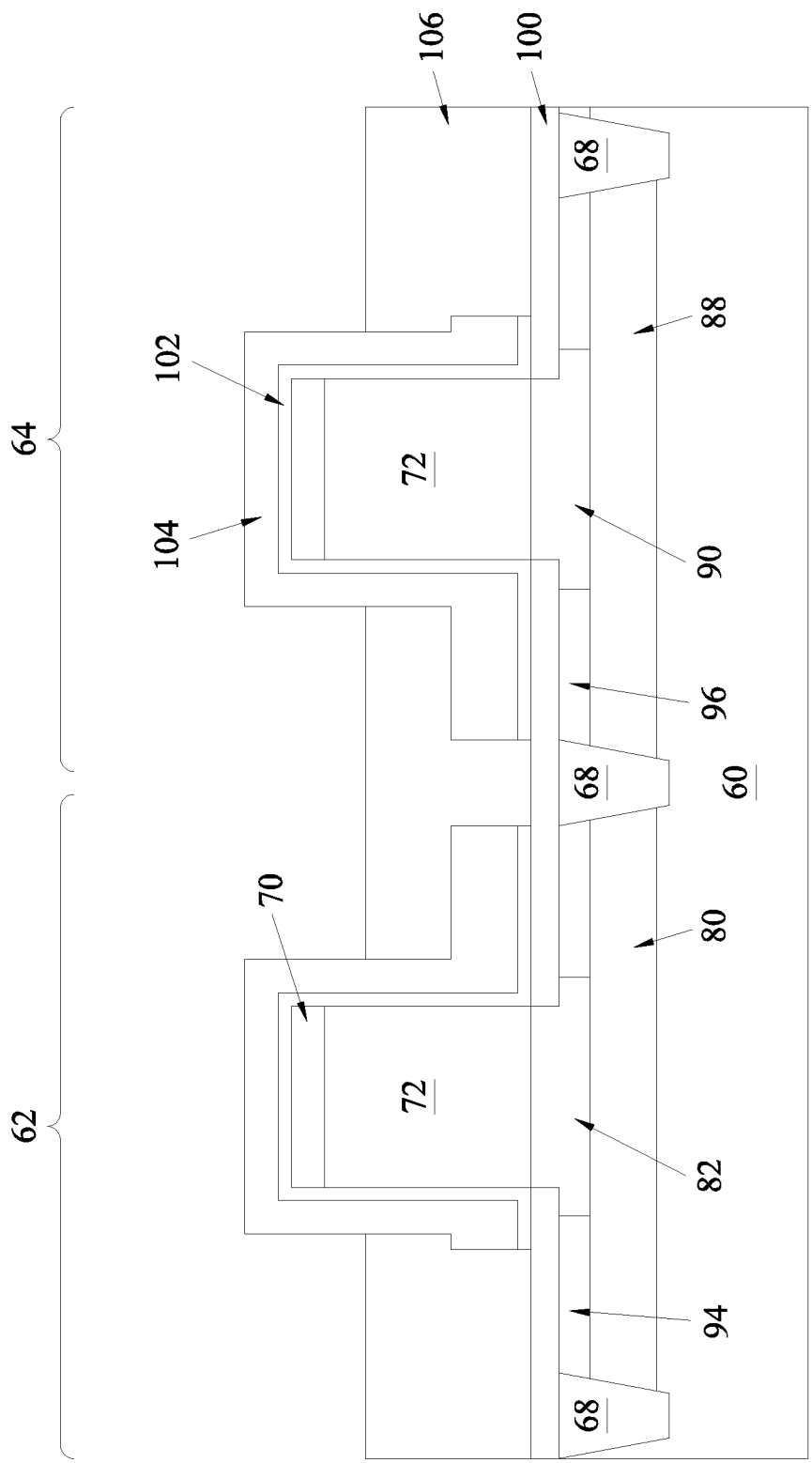

In FIG. 15, a second dielectric layer 106 is formed on the first dielectric layer 100 and the gate electrode layer 104 and around the vertical channel structures 72. The second dielectric layer 106 may comprise silicon oxide, tetraethyl orthosilicate (TEOS), PSG, BPSG, fluorinated silicate glass (FSG), $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. In some embodiments, the second dielectric layer 106 is deposited with a thickness greater than heights of the gate electrode layer 104. A planarization process, such as a CMP, is then performed to form top surfaces of the gate electrode layer 104 to be coplanar with a top surface of the second dielectric layer 106. Subsequently, a controlled etch back, such as an anisotropic etch, etches the second dielectric layer 106 to an appropriate thickness. The second dielectric layer 106 may serve various purposes, such as an Inter-Layer Dielectric (ILD).

Figure 16:
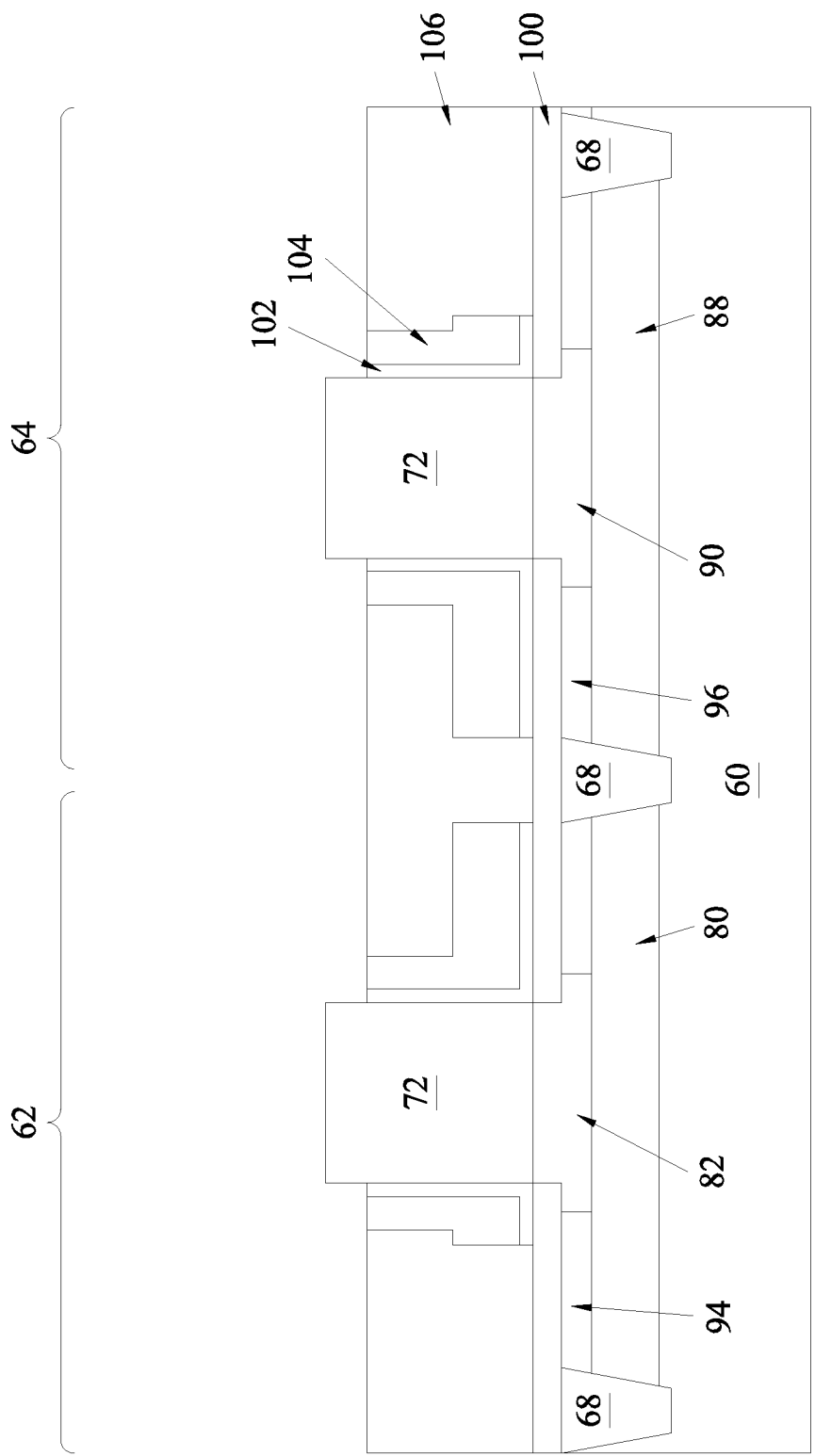

In FIG. 16, the gate electrode layer 104 and the gate dielectric layer 102 are etched back, and the mask caps 70 are removed from over the vertical channel structures 72. The gate electrode layer 104 and the gate dielectric layer 102 can be etched back using a controlled etch back that uses an appropriate etch process, such as an anisotropic or isotropic etch selective to the materials of the gate electrode layer 104 and the gate dielectric layer 102. After etching back the gate electrode layer 104 and the gate dielectric layer 102, the mask caps 70 are removed, such as by using an appropriate etching process selective to the material of the mask caps 70. After the etch backs of the second dielectric layer 106, the gate electrode layer 104, and the gate dielectric layer 102, the vertical channel structures 72 protrude from and above each of the second dielectric layer 106, gate electrode layer 104, and gate dielectric layer 102.

Figure 17:
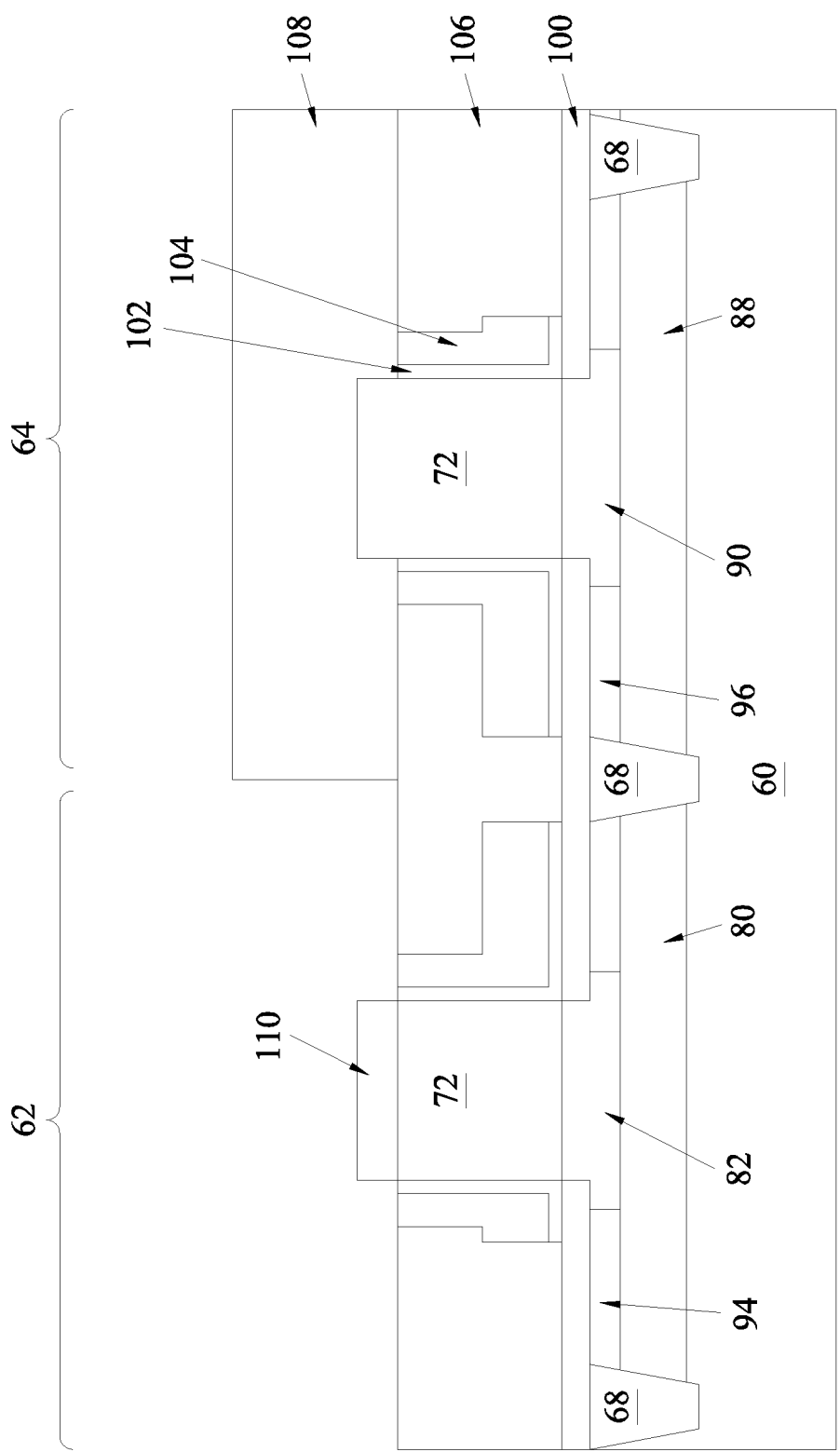

In FIG. 17, a photoresist 108 is formed on the second dielectric layer 106, the gate electrode layer 104, the gate dielectric layer 102, and the vertical channel structure 72 in the second region 64 of the substrate 60. The photoresist 108 can be formed by using a spin-on technique and patterned using acceptable photolithography techniques. Once the photoresist 108 is formed, an n-type dopant is implanted in the first region 62 of the substrate 60. The n-type dopant is implanted in the vertical channel structure 72 in the first region 62 of the substrate 60 to form an n+-doped source/drain region 110 in the portion of the vertical channel structure 72 in the first region 62 that protrudes above the second dielectric layer 106, the gate electrode layer 104, and the gate dielectric layer 102. Example species for implanting n-type dopants include arsenic (As), phosphorus (P), antimony (Sb), nitrogen (N), carbon (C), the like, or a combination thereof. A concentration of an n-type dopant in the n+-doped source/drain region 110 can be in a range from about $1\times10^{20}$ cm$^{-3}$ to about $7\times10^{21}$ cm$^{-3}$. The photoresist 108 can then be removed, such by as an appropriate ashing.

Figure 18:
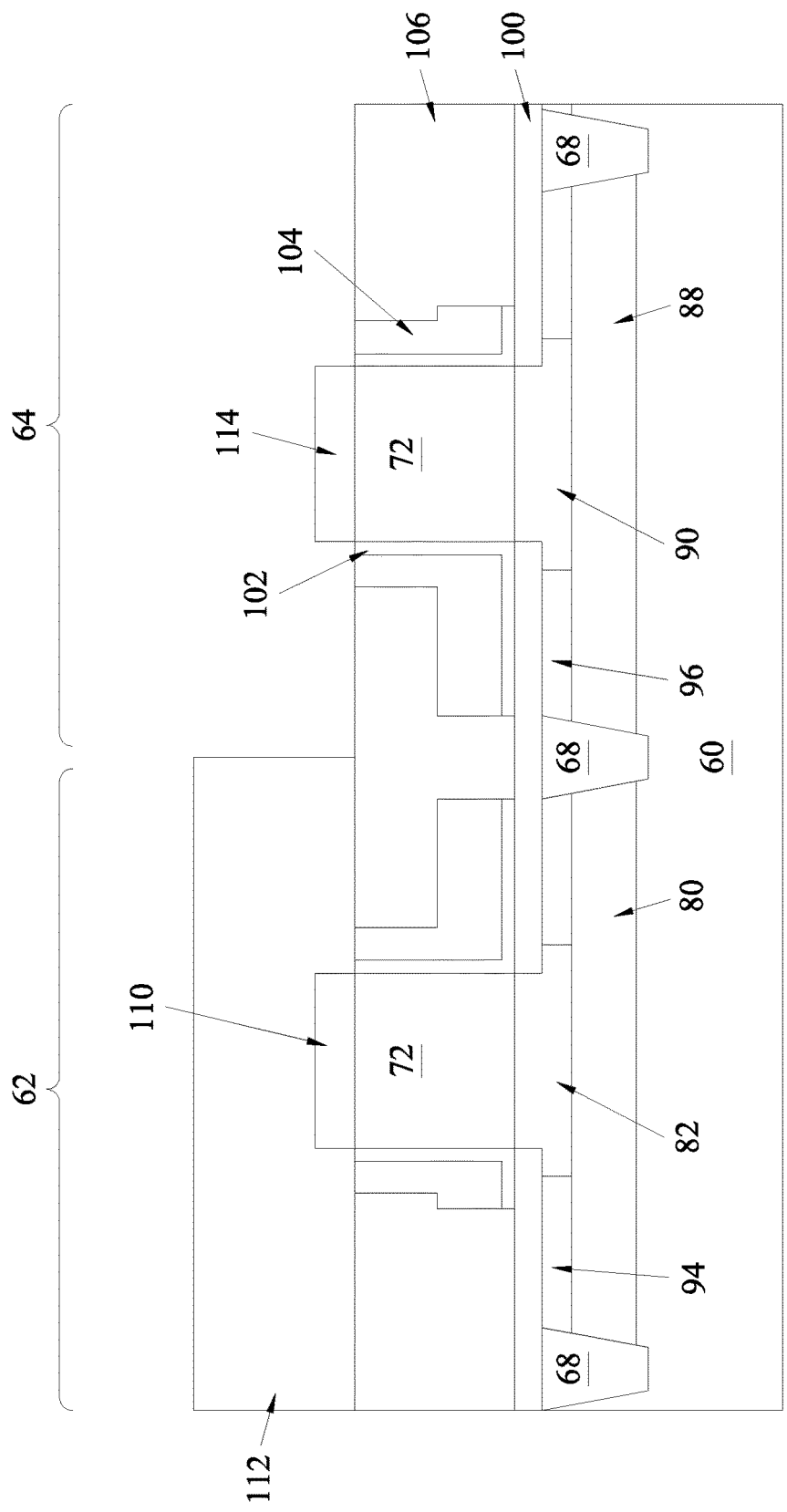

In FIG. 18, a photoresist 112 is formed on the second dielectric layer 106, the gate electrode layer 104, the gate dielectric layer 102, and the vertical channel structure 72 in the first region 62 of the substrate 60. The photoresist 112 can be formed by using a spin-on technique and patterned using acceptable photolithography techniques. Once the photoresist 112 is formed, a p-type dopant is implanted in the second region 64 of the substrate 60. The p-type dopant is implanted in the vertical channel structure 72 in the second region 64 of the substrate 60 to form a p+-doped source/drain region 114 in the portion of the vertical channel structure 72 in the second region 64 that protrudes above the second dielectric layer 106, the gate electrode layer 104, and the gate dielectric layer 102. Example species for implanting p-type dopants include boron (B), $BF_2$, indium (In), nitrogen (N), carbon (C), the like, or a combination thereof. A concentration of a p-type dopant in the p+-doped source/drain region 114 can be in a range from about $1\times10^{20}$ cm$^{-3}$ to about $5\times10^{21}$ cm$^{-3}$. The photoresist 112 can then be removed, such by as an appropriate ashing.

Figure 19:
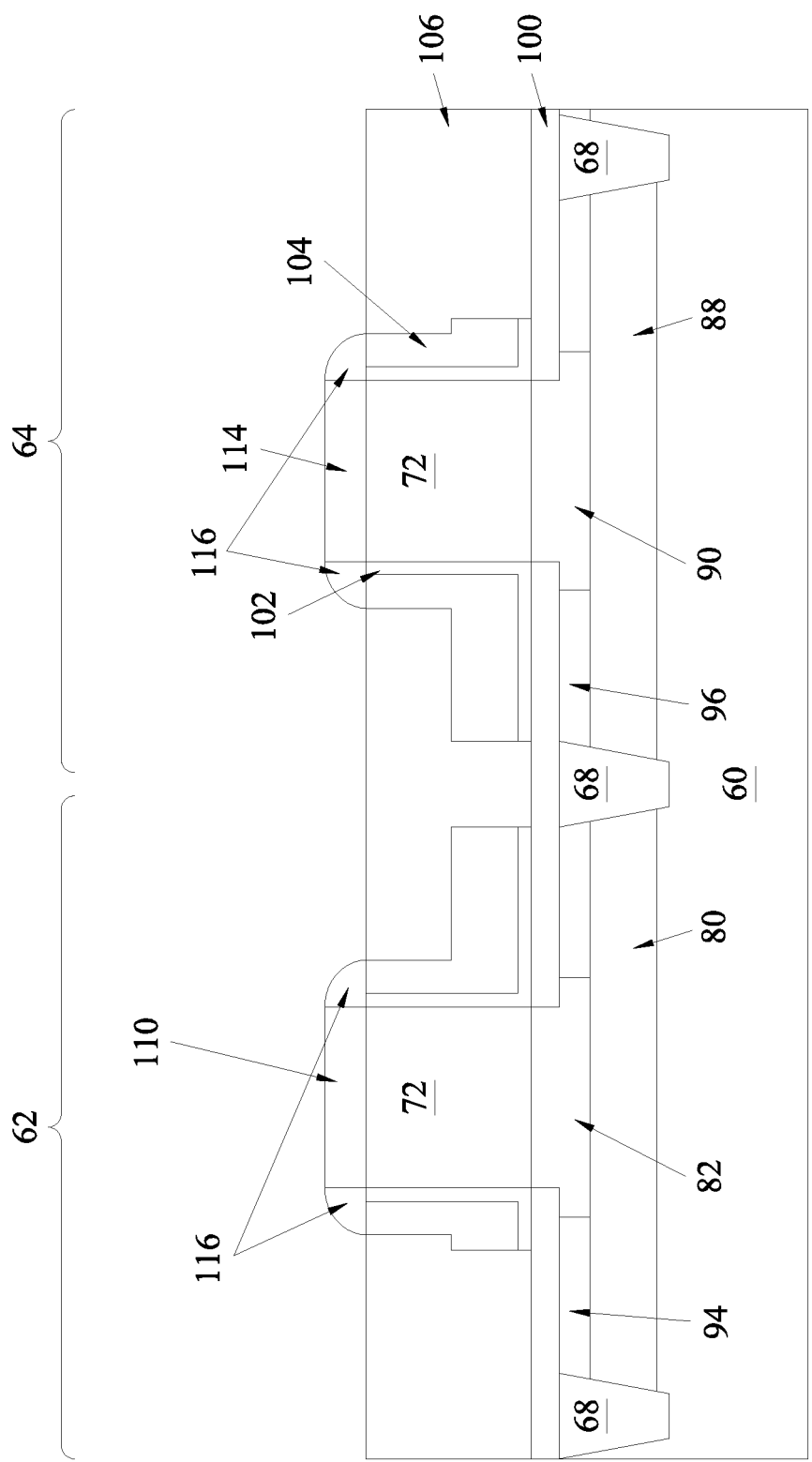

In FIG. 19, spacers 116 are formed around and along sidewalls of the portions of the vertical channel structures 72 that protrude above the second dielectric layer 106, the gate electrode layer 104, and the gate dielectric layer 102. In some embodiments, a spacer layer is conformally deposited over the second dielectric layer 106, the gate electrode layer 104, and the gate dielectric layer 102, and the vertical channel structures 72 and along the sidewalls of the vertical channel structures 72 such that the thickness of the spacer layer is substantially a same thickness throughout the layer. In some embodiments, the spacer layer is made of SiN, SiON, SiC, SiCN, SiOCN, the like, or a combination thereof. The spacer layer may be deposited using an appropriate deposition process, such as ALD, CVD, PVD, the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the spacers 116 around and along the sidewalls of the vertical channel structures 72 that protrude above the second dielectric layer 106, the gate electrode layer 104, and the gate dielectric layer 102.

Figure 20:
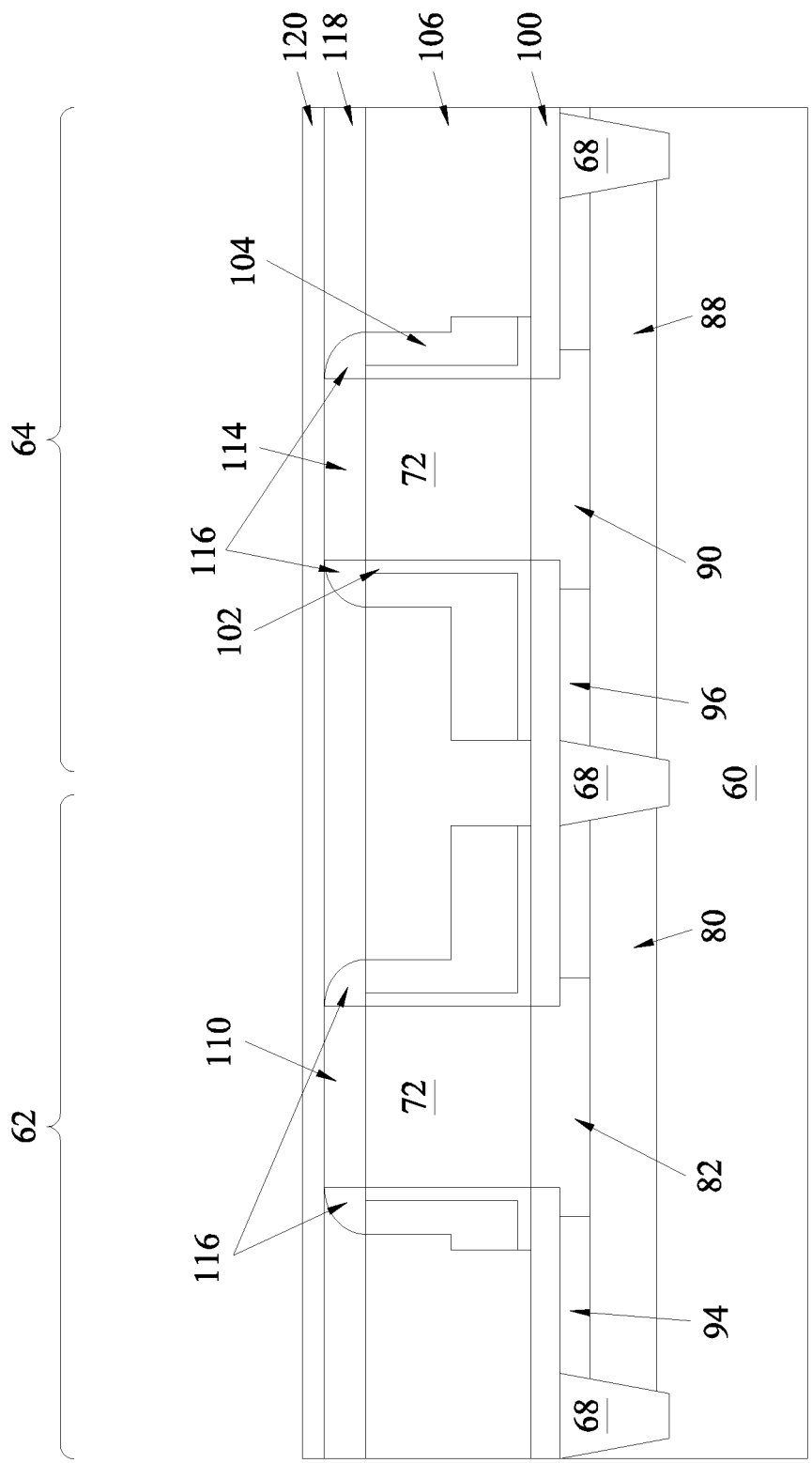

In FIG. 20, a third dielectric layer 118 is formed on the second dielectric layer 106 and the spacers 116 and around the vertical channel structures 72 and a semiconductor layer 120 is formed over the third dielectric layer 118. The third dielectric layer 118 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. In some embodiments, the third dielectric layer 118 is deposited with a thickness greater than heights of the vertical channel structures 72. A planarization process, such as a CMP, is then performed to form top surfaces of the vertical channel structures 72 to be coplanar with a top surface of the third dielectric layer 118. This can cause the source/drain regions 110 and 114 of the vertical channel structures 72 to be exposed through the third dielectric layer 118.

The semiconductor layer 120 is formed over the third dielectric layer 118 and on the exposed surfaces of the vertical channel structures 72. The semiconductor layer 120 can be silicon, such as amorphous or polycrystalline, or the like. The semiconductor layer 120 can be formed using any suitable method, such as CVD, PECVD, the like, or a combination thereof.

Figure 21:
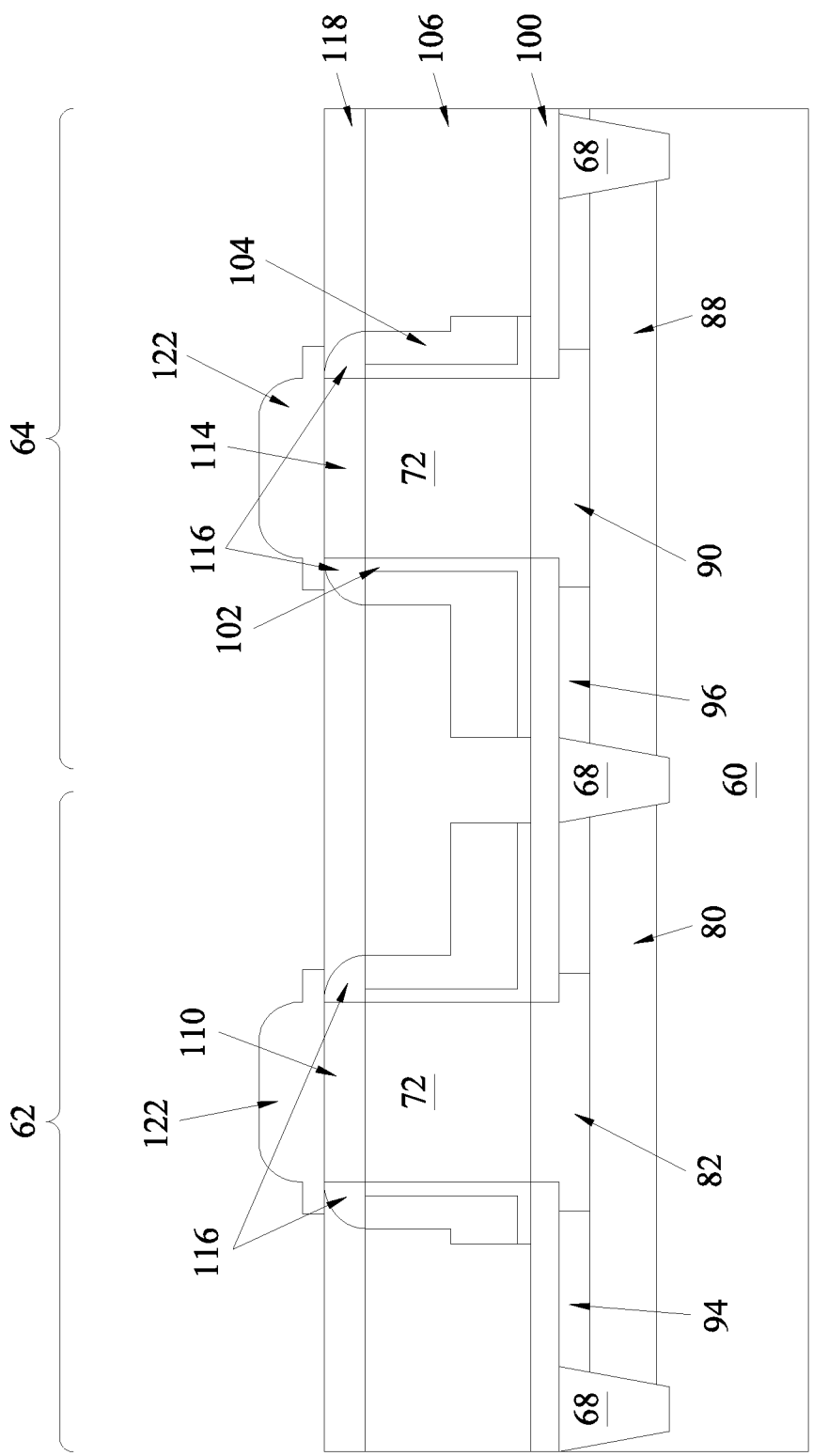

In FIG. 21, metal-semiconductor compound regions 122 are formed over the third dielectric layer 118 and on the exposed surfaces of the vertical channel structures 72. In some embodiments, the semiconductor layer 120 is patterned to correspond to the metal-semiconductor compound regions 122. Then, a metal can be deposited on remaining portions of the semiconductor layer 120 and on the third dielectric layer 118. The metal can be reacted with the remaining portions of the semiconductor layer 120. In some embodiments, the metal can include cobalt, titanium, nickel, tungsten, the like, or a combination thereof, and can be deposited by PVD, ALD, CVD, the like, or a combination thereof. The metal can be caused to react with the semiconductor layer 120 by using an anneal. Any unreacted metal that remains after the anneal can be removed using an etch selective to the material of the unreacted metal. The metal-semiconductor compound regions 122 can include CoSi, CoNiSi, TiSi, NiSi, WSi, PtSi, MoSi, the like, or a combination thereof. In other embodiments, other conductive features can be used instead of or in combination with the metal-semiconductor compound regions 122, such as a semiconductor which may be doped; a metal such as W, Cu, and Al; a metal-alloy such as TiN and TaN; the like, or a combination thereof.

Figure 22:
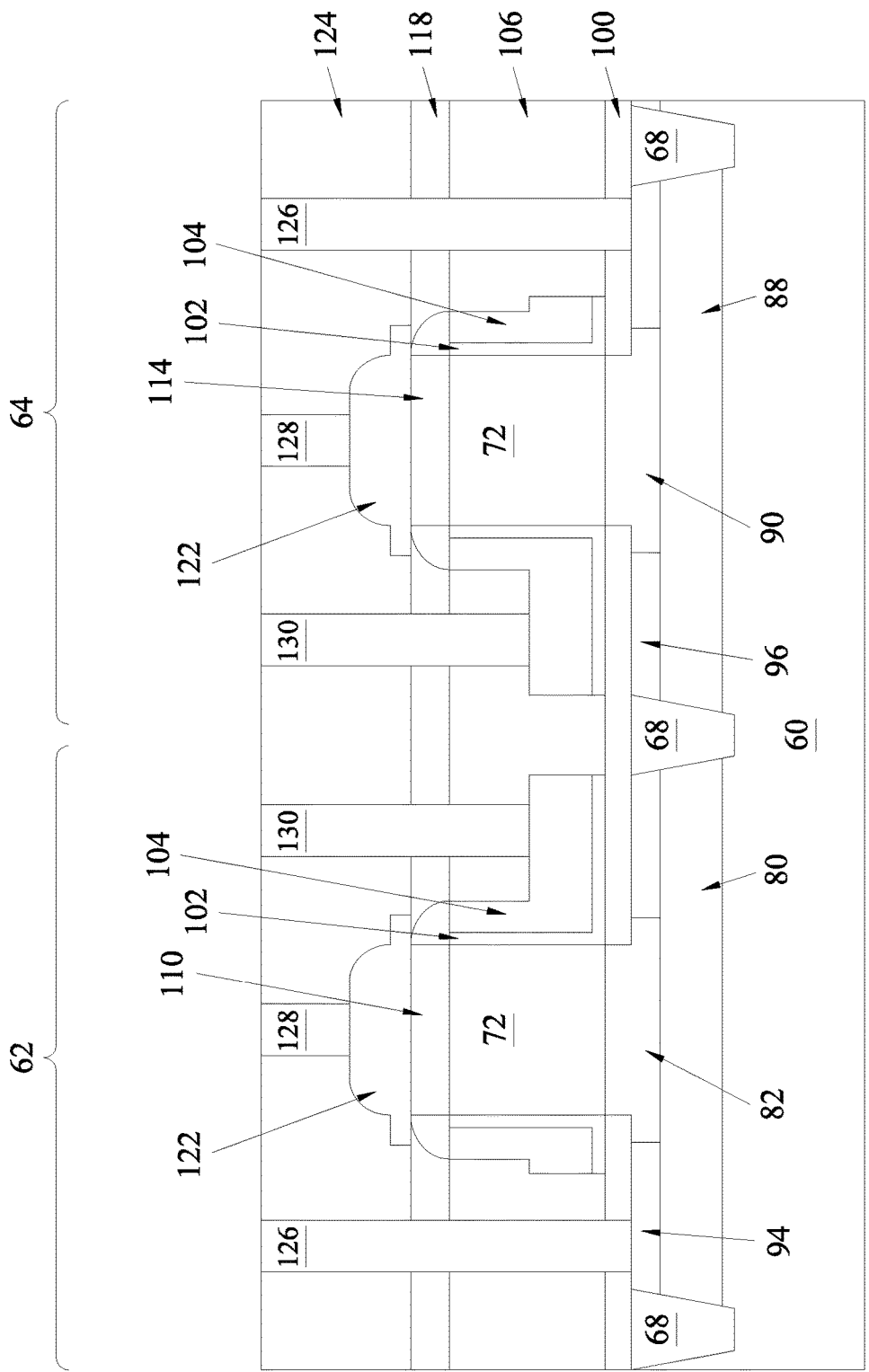

In FIG. 22, a fourth dielectric layer 124, such as an ILD, is formed over the third dielectric layer 118 and the metal-semiconductor compound regions 122, and contacts 126, 128, and 130 are formed through various dielectric layers to various components. The fourth dielectric layer 124 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the second dielectric layer 106.

Openings for the contacts 126, 128, and 130 can be formed using one or more etching steps. Openings for contacts 126 are etched through the fourth dielectric layer 124, third dielectric layer 118, second dielectric layer 106, and first dielectric layer 100 to respective metal-semiconductor compound regions 94 and 96. Openings for contacts 128 are etched through the fourth dielectric layer 124 to respective metal-semiconductor compound regions 122. Openings for contacts 130 are etched through the fourth dielectric layer 124, third dielectric layer 118, and second dielectric layer 106 to respective gate electrode layer 104. The openings may be formed using acceptable photolithography and etching techniques.

A liner, such as a diffusion barrier layer, an adhesion layer, or the like, and a conductive material are formed in the openings. The liner may include titanium, titanium nitride, tantalum, tantalum nitride, or the like formed by ALD, CVD, or the like. The conductive material may be copper, a copper alloy, silver, gold, tungsten, aluminum, nickel, or the like formed by ALD, CVD, PVD, or the like. A planarization process, such as a CMP, may be performed to remove excess material from a surface of the fourth dielectric layer 124. The remaining liner and conductive material form contacts 126, 128, and 130 in the openings. Contacts 126 are physically and electrically coupled to respective metal-semiconductor compound regions 94 and 96. Contacts 128 are physically and electrically coupled to respective metal-semiconductor compound regions 122. Contacts 130 are physically and electrically coupled to respective gate electrode layers 104. Contact 126 may be referred to as active area contacts or source contacts. Contacts 128 may be referred to as top plate contacts or drain contacts. Contacts 130 may be referred to as gate contacts.

One having ordinary skill in the art will readily understand that additional dielectric layers, such as IMDs, can be formed, which dielectric layer can include additional metallizations and vias. Further, one having ordinary skill in the art will readily understand that the layers and/or levels discussed herein can be modified. For example, contacts 126, 128, and 130 can be modified and/or obviated if overlying vias extend through one or more of the dielectric layers 124, 118, 106, and 100, such as when an overlying via physically and electrically couples a metal-semiconductor compound region 122.

Figure 23A:
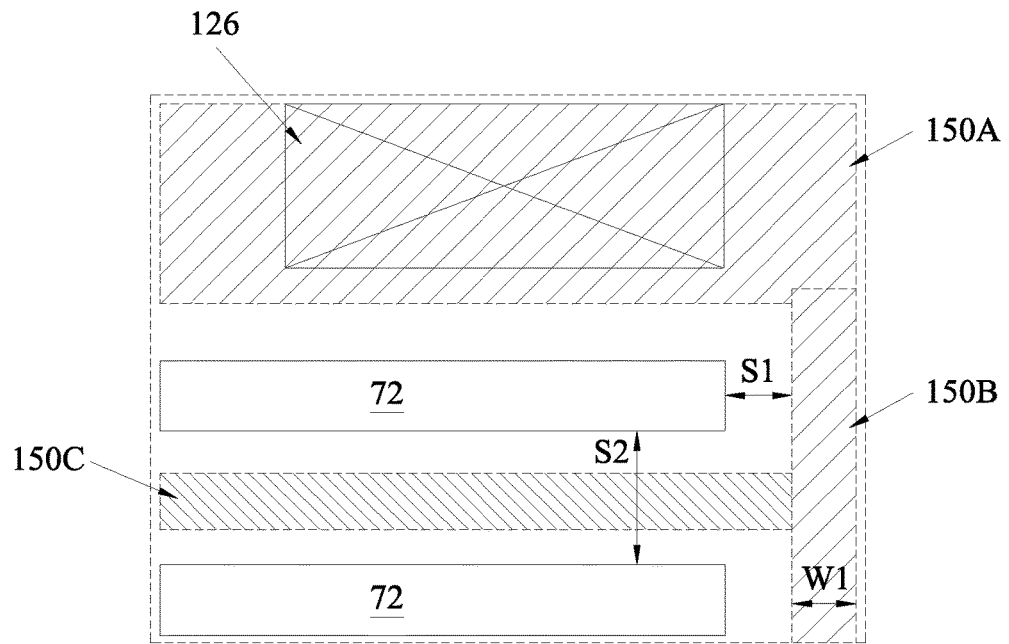
FIGS. 23A and 23B are plan views of metal-semiconductor compound and device configurations of VGAA device structures formed in accordance with some embodiments.
Figure 23B:
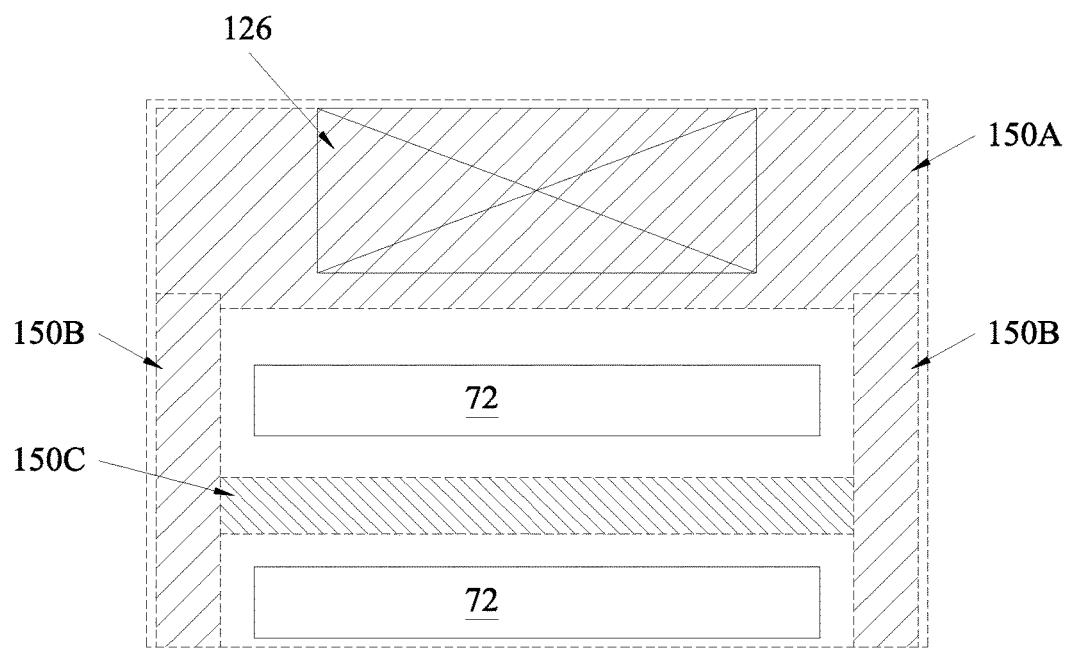

FIGS. 23A and 23B are plan views of metal-semiconductor compound and device configurations of VGAA device structures formed in accordance with some embodiments. The plan views of FIGS. 23A and 23B include two vertical channel structures 72 (e.g. nanobars 72) with metal-semiconductor compound regions 150 (150A, 150B, and 150C) adjacent the vertical channel structures 72 and contact 126 electrically and physically coupled to the metal-semiconductor compound regions 150. The metal-semiconductor compound regions 150 are similar to the metal-semiconductor compound regions 94 and 96 as discussed above and the description is not repeated herein. The metal-semiconductor compound regions 150 could represent either of the metal-semiconductor compound regions 94 or 96 depending on the configuration of the VGAA device structure.

In FIGS. 23A through 28B, the pairs of vertical channel structures 72 in the figures can have a single gate electrode (e.g. 104) adjoining the sides of both of the vertical channel structures 72 in each pair. In other embodiments, each of the vertical channel structures 72 can have a separate gate electrode.

As discussed above the metal-semiconductor compound regions 150 are spaced from sidewalls and ends of the vertical channel structures 72 by the spacing S1. In some embodiments, the spacing S1 is in a range from about −3 nm to about 20 nm. In other words, the metal-semiconductor compound regions 150 could undercut the sidewalls of the vertical channel structures 72 by up to about 3 nm (hence, the lower limit spacing S1 being about −3 nm) or be spaced from the sidewalls by up to 20 nm. The vertical channel structures 72 could be spaced from the nearest adjacent vertical channel structure 72 by a spacing S2. In some embodiments, the spacing S2 is in a range from about 1 nm to about 50 nm.

The metal-semiconductor compound regions 150 have been illustrated to be divided into several different types of metal-semiconductor compound regions 150 (e.g. 150A, 150B, 150C, etc.) in FIGS. 23A and 23B and subsequent figures. This is to aid the discussion and the various types of metal-semiconductor compound regions 150 are formed as a continuous metal-semiconductor compound region 150 by a same process at a same time.

The metal-semiconductor compound region 150A is formed along and adjacent a sidewall of at least one of the vertical channel structures 72 and has the contact 126 directly contacting it. The metal-semiconductor compound region 150B is formed along and adjacent an end at least one of the vertical channel structures 72. In some embodiments, the metal-semiconductor compound region 150B has a width W1 that is in a range from about 1 nm to about 30 nm. The metal-semiconductor compound region 150C is formed along and between at least two of the vertical channel structures 72. In some embodiments, the metal-semiconductor compound region 150A directly adjoins at least one of the metal-semiconductor compound regions 150B, and the metal-semiconductor compound region 150B directly adjoins at least one of the metal-semiconductor compound regions 150C.

In the embodiment of FIG. 23A, the metal-semiconductor compound region 150 surrounds at least three sides of one of the vertical channel structures 72 and at least two sides of another one of the vertical channel structures 72. In the embodiment of FIG. 23A, the metal-semiconductor compound region 150 surrounds all four sides of one of the vertical channel structures 72 and at least three sides of another one of the vertical channel structures 72.

Figure 24A:
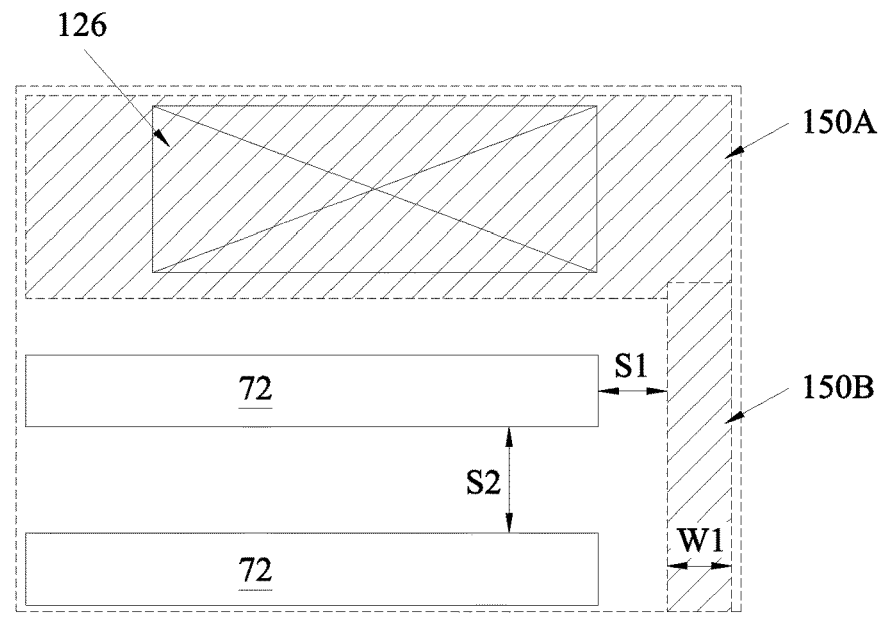
FIGS. 24A and 24B are plan views of metal-semiconductor compound and device configurations of VGAA device structures formed in accordance with some embodiments.
Figure 24B:
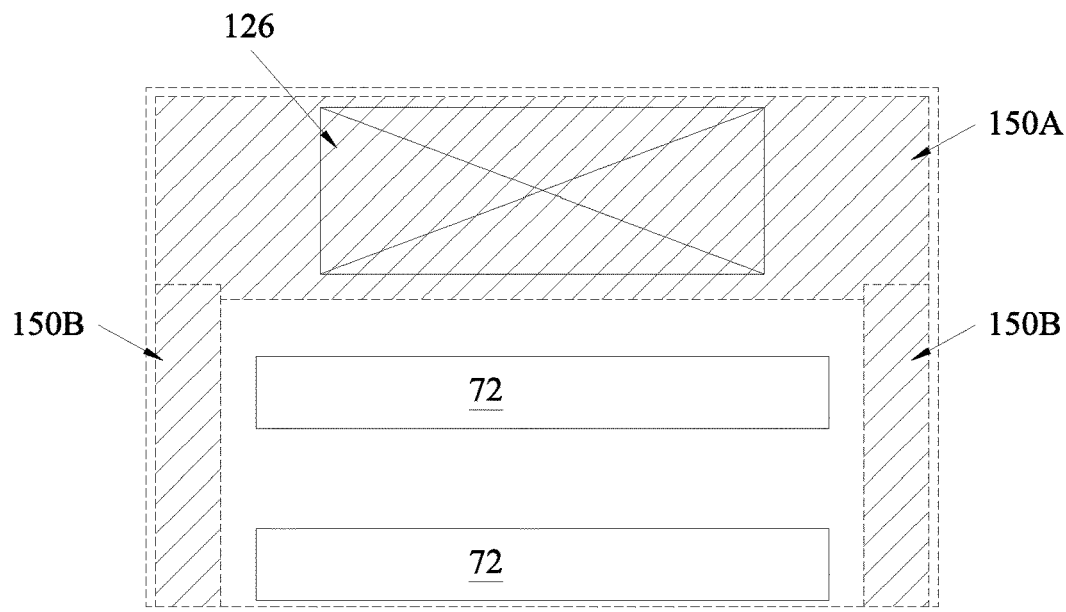

FIGS. 24A and 24B are plan views of metal-semiconductor compound and device configurations of VGAA device structures formed in accordance with some embodiments. The embodiments in FIGS. 24A and 24B are similar to the embodiments of FIGS. 23A and 23B except that the embodiments of FIGS. 24A and 24B do not have a metal-semiconductor compound region 150 between (see 150C in FIGS. 23A and 23B) adjacent vertical channel structures 72. Details of the previously described embodiments are not repeated herein.

Figure 25A:
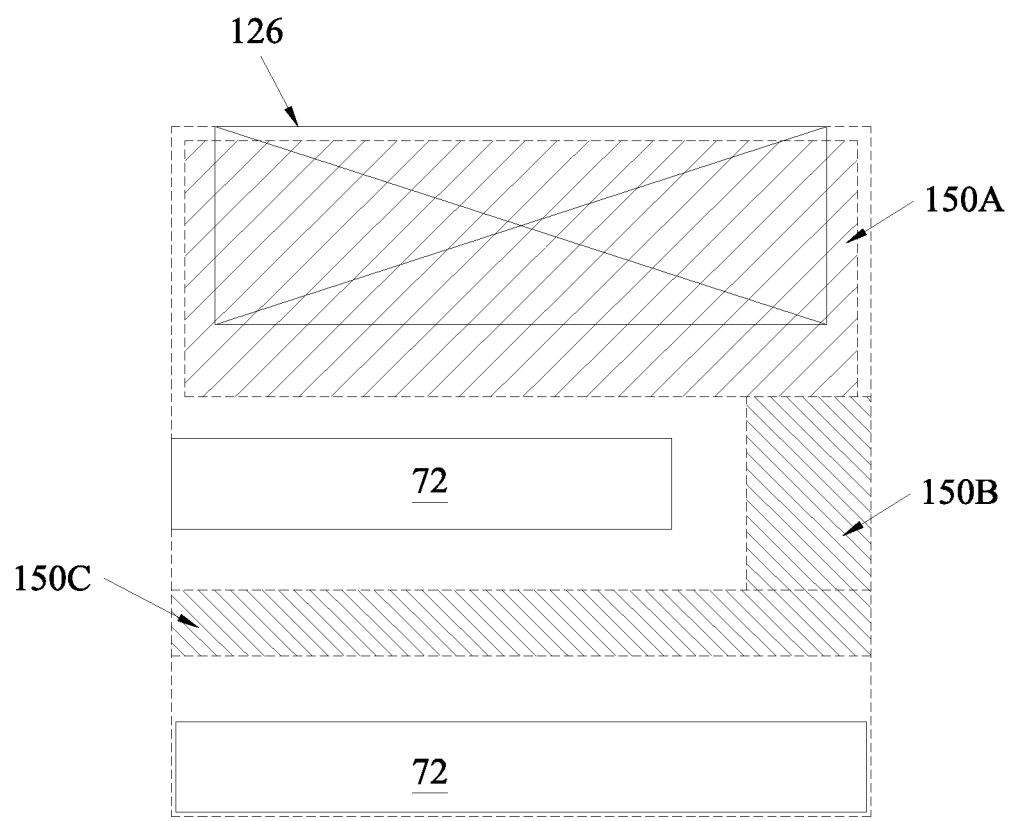
FIGS. 25A, 25B, and 25C are plan views of metal-semiconductor compound and device configurations of VGAA device structures formed in accordance with some embodiments.
Figure 25B:
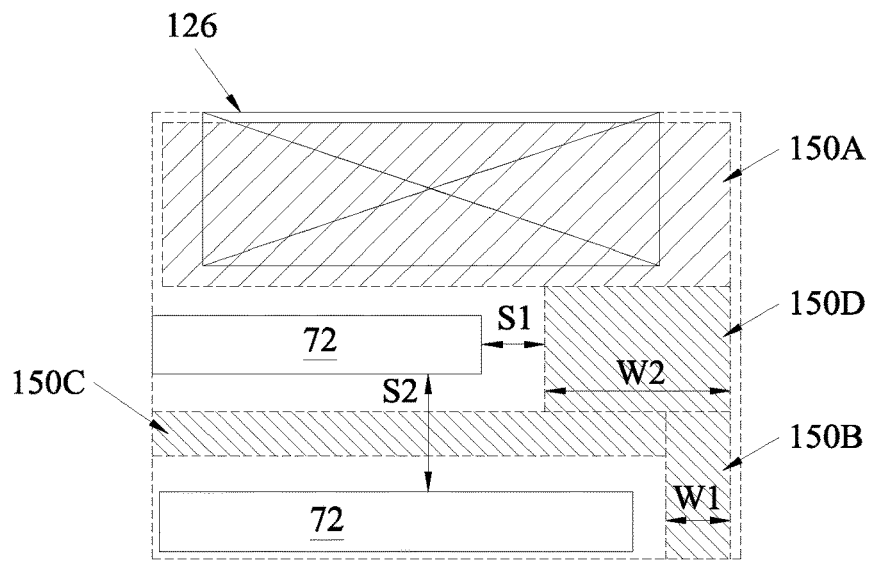
Figure 25C:
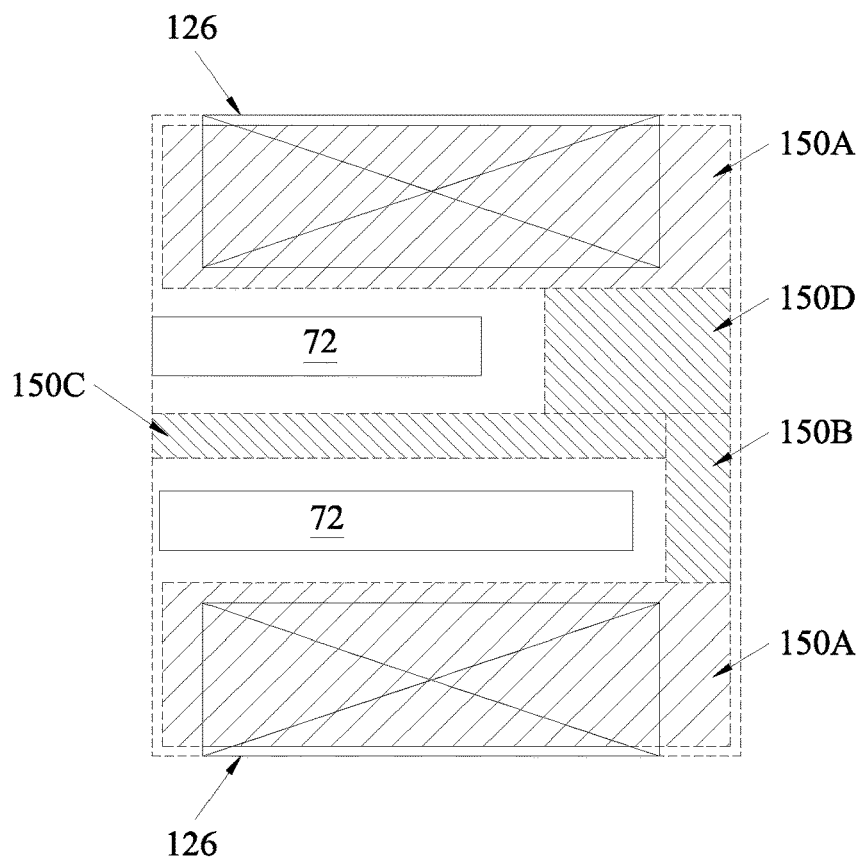

FIGS. 25A, 25B, and 25C are plan views of metal-semiconductor compound and device configurations of VGAA device structures formed in accordance with some embodiments. The embodiments in FIGS. 25A, 25B, and 25C are similar to the previous embodiments except that the embodiments of FIGS. 25A, 25B, and 25C have vertical channel structures 72 that are offset from each such that their ends are not aligned. Details of the previously described embodiments are not repeated herein.

FIG. 25A illustrates an embodiment with metal-semiconductor compound region 150B being adjacent an end of one of the vertical channel structures 72 but not adjacent an end of the other vertical channel structure 72. This asymmetrical configuration of the metal-semiconductor compound region 150B causes the vertical channel structures 72 to be offset.

FIG. 25B illustrates an embodiment with a narrow metal-semiconductor compound region 150B being adjacent an end of one of the vertical channel structures 72 and a wider metal-semiconductor compound region 150D adjacent an end of the other vertical channel structure 72. In some embodiments, the metal-semiconductor compound region 150D has a width W2 in a range from about 2 nm to about 60 nm. This asymmetrical configuration of the metal-semiconductor compound regions 150B and 150D causes the vertical channel structures 72 to be offset.

FIG. 25C illustrates an embodiment similar to the embodiment in FIG. 25B except that this embodiment further includes another metal-semiconductor compound region 150A and another contact 126 directly contacting this metal-semiconductor compound region 150A. In this embodiment, each of the vertical channel structures 72 has a metal-semiconductor compound region 150A and a contact 126.

Figure 26A:
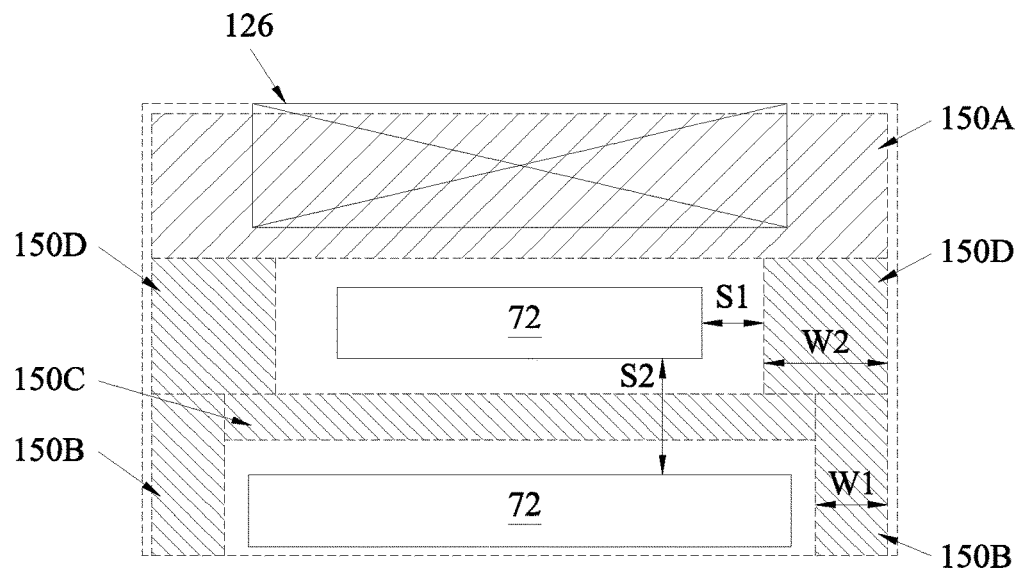
FIGS. 26A and 26B are plan views of metal-semiconductor compound and device configurations of VGAA device structures formed in accordance with some embodiments.
Figure 26B:
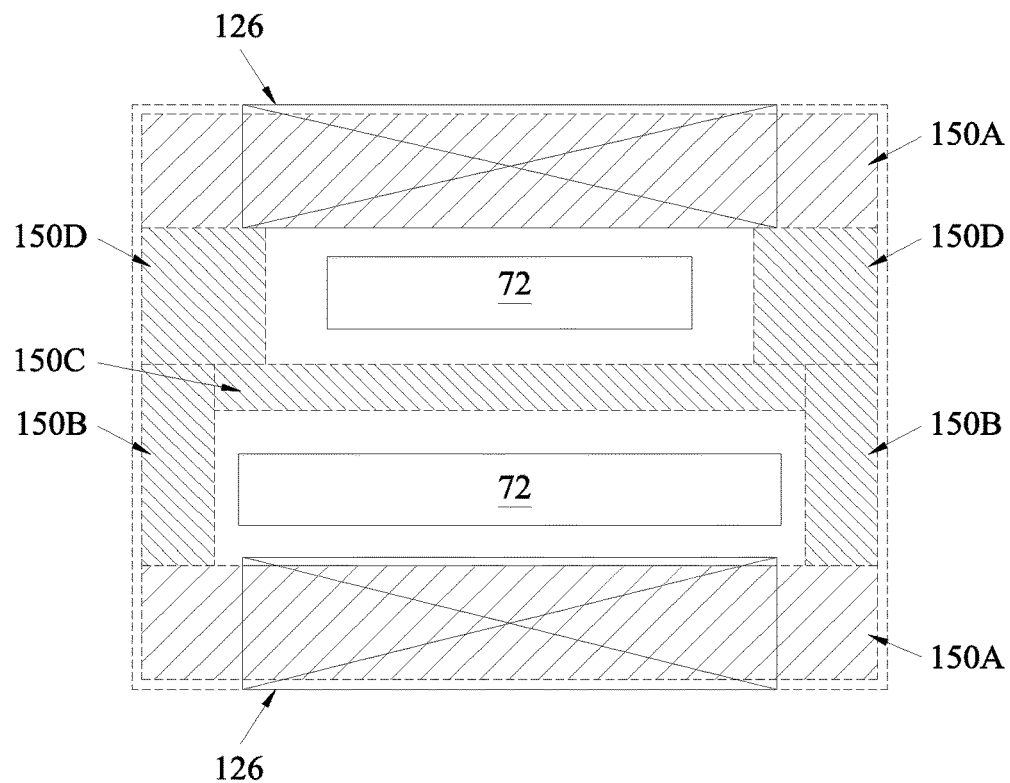

FIGS. 26A and 26B are plan views of metal-semiconductor compound and device configurations of VGAA device structures formed in accordance with some embodiments. FIG. 26A illustrates an embodiment similar to the embodiment in FIG. 25B except that this embodiment further includes another metal-semiconductor compound region 150B and another metal-semiconductor compound region 150D on the other ends of the vertical channel structures 72. In this embodiment, each of the vertical channel structures 72 has a metal-semiconductor compound region 150 on at least three sides of the vertical channel structures 72.

FIG. 26B illustrates an embodiment similar to the embodiment in FIG. 26A except that this embodiment further includes another metal-semiconductor compound region 150A and another contact 126 directly contacting this metal-semiconductor compound region 150A. In this embodiment, each of the vertical channel structures 72 has a metal-semiconductor compound region 150A and a contact 126 and each of the vertical channel structures 72 has a metal-semiconductor compound region 150 on all four sides of the vertical channel structures 72.

Figure 27A:
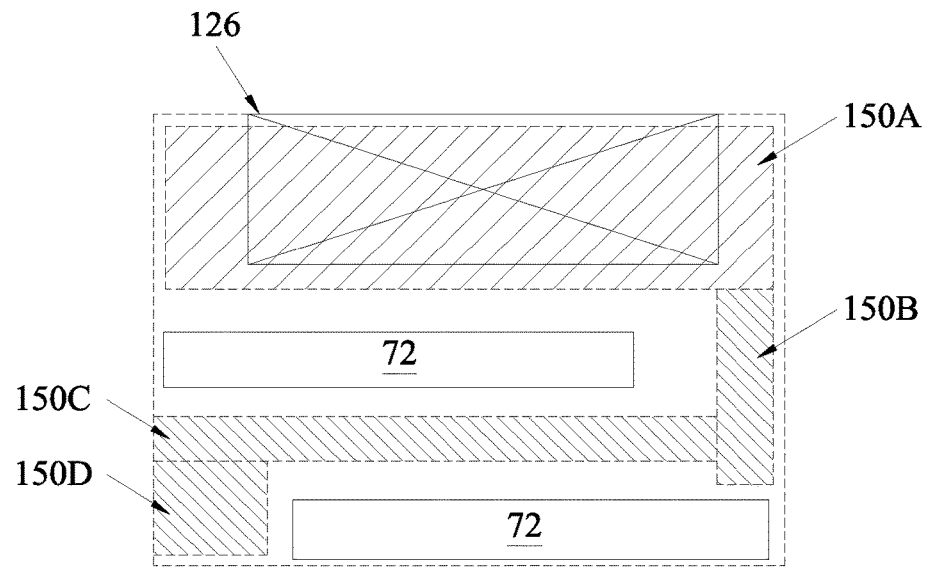
FIGS. 27A, 27B, 27C, and 27D are plan views of metal-semiconductor compound and device configurations of VGAA device structures formed in accordance with some embodiments.

FIGS. 27A, 27B, 27C, and 27D are plan views of metal-semiconductor compound and device configurations of VGAA device structures formed in accordance with some embodiments. FIG. 27A illustrates an embodiment similar to the embodiment in FIG. 25A except that this embodiment further includes a metal-semiconductor compound region 150D on an end of one of the vertical channel structures 72. In this embodiment, the metal-semiconductor compound region 150B is one an end of one of the vertical channel structures 72 and the metal-semiconductor compound region 150D is one an opposite end of another one of the vertical channel structures 72.

Figure 27B:
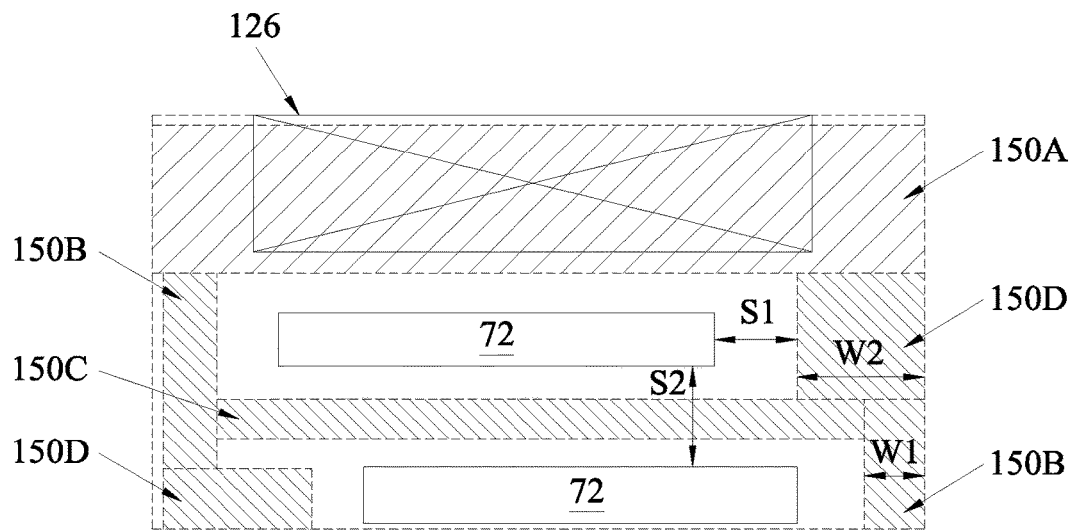

FIG. 27B illustrates an embodiment similar to the embodiment in FIG. 27A except that in this embodiment each of the vertical channel structures 72 has a metal-semiconductor compound region 150B on one end and a metal-semiconductor compound region 150D on the other end. In this embodiment, one of the vertical channel structures 72 has the metal-semiconductor compound region 150B on a first end and the metal-semiconductor compound region 150D on a second end while the other vertical channel structure has the metal-semiconductor compound region 150D on the first end and the metal-semiconductor compound region 150B on the second end.

Figure 27C:
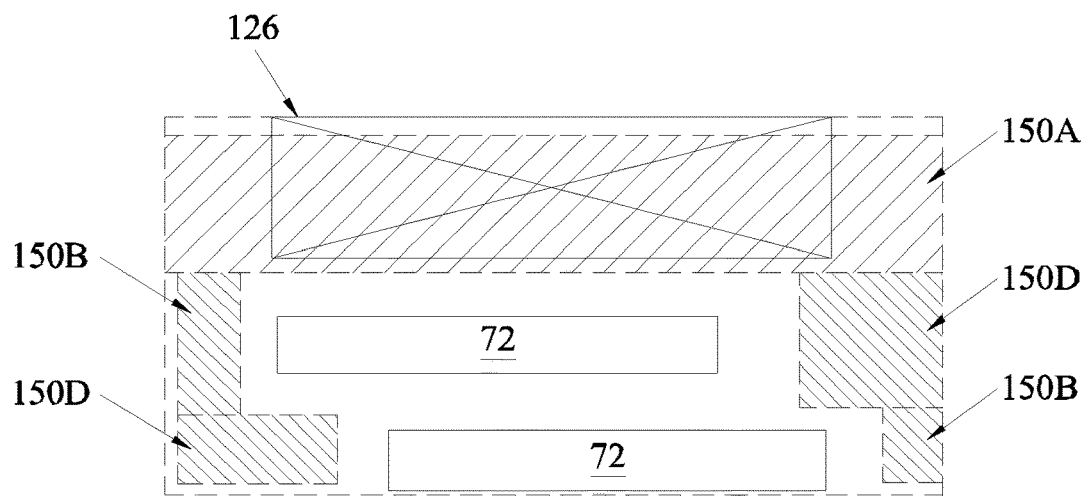

FIG. 27C illustrates an embodiment similar to the embodiment in FIG. 27A except that in this embodiment does not include a metal-semiconductor compound region 150C between the vertical channel structures 72.

Figure 27D:
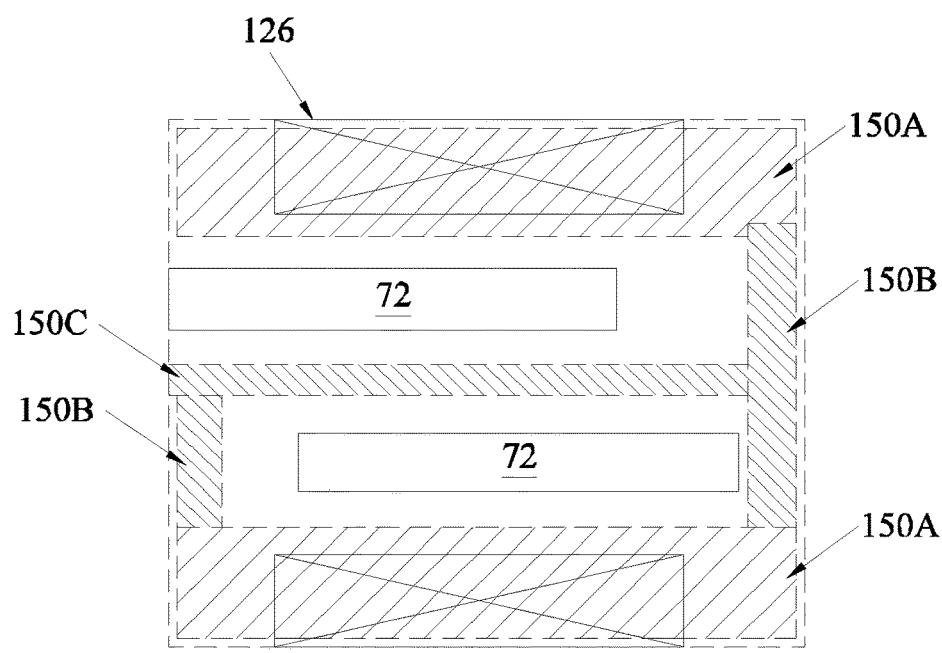

FIG. 27D illustrates an embodiment similar to the embodiment in FIG. 27A except that in this embodiment the metal-semiconductor compound region 150D in FIG. 27A is replaced with a narrower metal-semiconductor compound region 150B and this embodiment further includes another metal-semiconductor compound region 150A and another contact 126 directly contacting this metal-semiconductor compound region 150A.

Figure 28A:
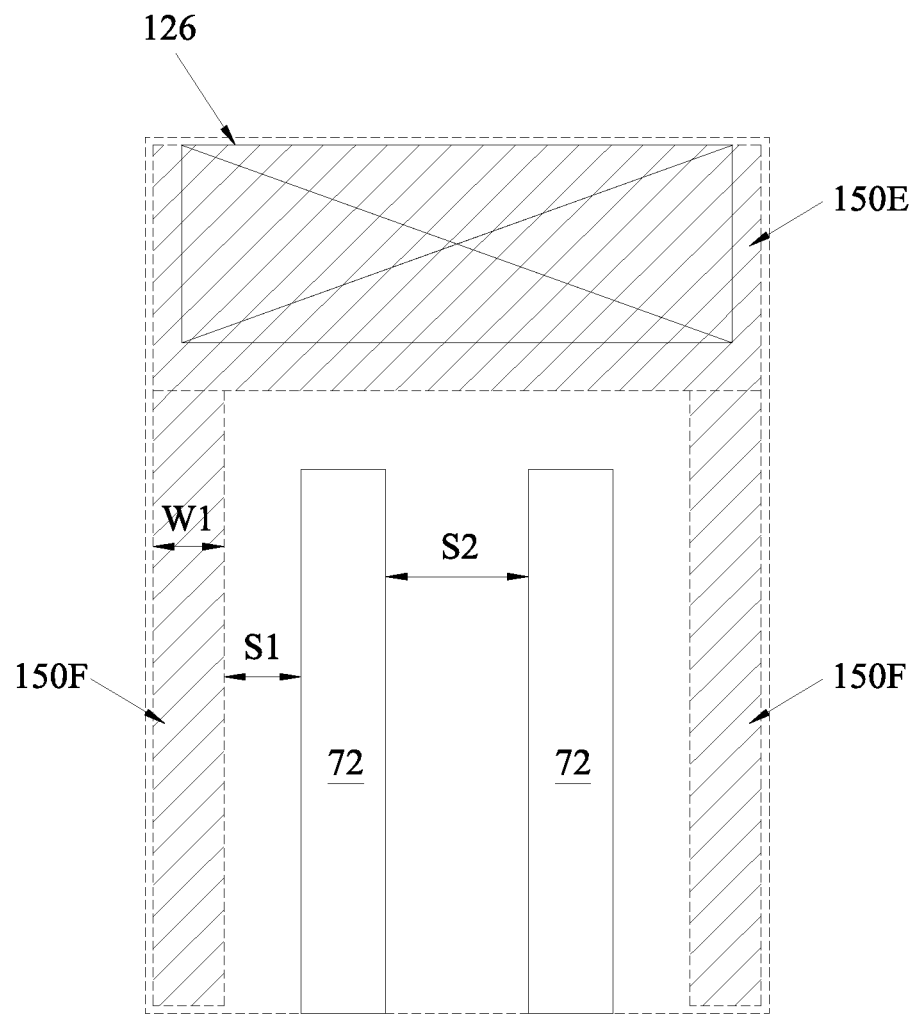
FIGS. 28A and 28B are plan views of metal-semiconductor compound and device configurations of VGAA device structures formed in accordance with some embodiments.
Figure 28B:
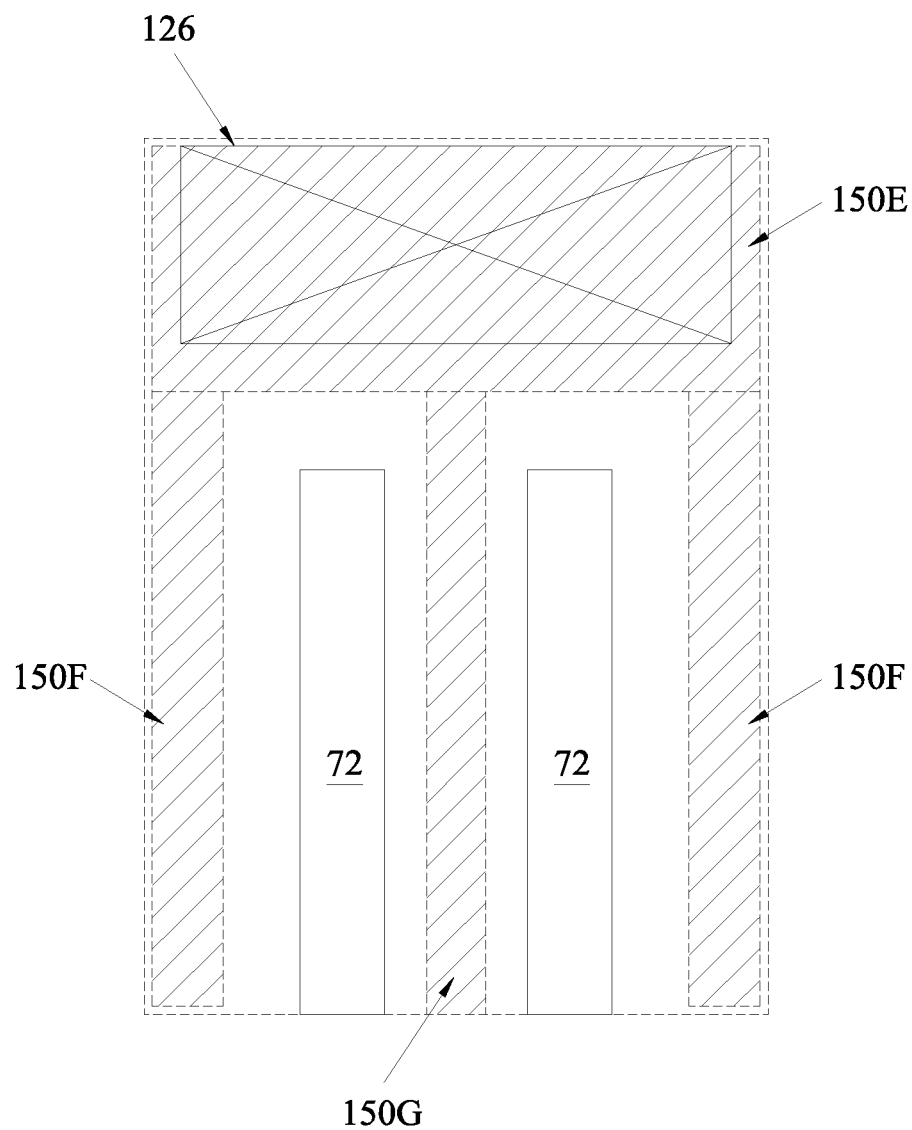

FIGS. 28A and 28B are plan views of metal-semiconductor compound and device configurations of VGAA device structures formed in accordance with some embodiments. The embodiments in FIGS. 28A and 28B are similar to the previous embodiments except that the embodiments of FIGS. 28A and 28B have the contacts 126 directly contacting the metal-semiconductor compound regions 150 adjacent the ends of the vertical channel structures 72. Details of the previously described embodiments are not repeated herein.

The metal-semiconductor compound region 150E is formed along and adjacent an end of at least one of the vertical channel structures 72 and has the contact 126 directly contacting it. The metal-semiconductor compound region 150F is formed along and adjacent a sidewall of at least one of the vertical channel structures 72. The metal-semiconductor compound region 150G is formed adjacent sidewalls and between at least two of at least one of the vertical channel structures 72. In some embodiments, the metal-semiconductor compound region 150F has the width W1 that is in a range from about 1 nm to about 30 nm. In some embodiments, the metal-semiconductor compound region 150E directly adjoins at least one of the metal-semiconductor compound regions 150F, and the metal-semiconductor compound region 150F directly adjoins at least one of the metal-semiconductor compound regions 150G.

Some embodiments may achieve advantages. Some embodiments can incorporate the emerging technology of VGAA transistors. Further, some embodiments have improved performance due to the reduced resistance between the source/drain contact (e.g. contact 126) and the vertical channel structure (e.g. structure 72) as enabled by the metal-semiconductor compound regions (e.g. region 94, 96, and/or 150) at least partially surrounding the vertical channel structure 72. The metal-semiconductor regions have lower resistance than the doped regions (e.g. regions 80 and 88) they overlie, and thus, a current passing between the vertical channel structure and the source/drain contact can pass mainly through the lower resistance metal-semiconductor compound regions as opposed to the higher resistance doped regions. In addition, because the metal-semiconductor compound regions are formed at least partially surrounding, if not completely surrounding, the vertical channel structures, the lower resistance path of the metal-semiconductor compound regions can be utilized for almost any part of the vertical channel structure, even when it is elongated such as a nanobar structure. By having the metal-semiconductor compound regions at least partially surrounding the vertical channel structures, the resistance of the device can be improved by up to about 10 percent.

An embodiment is a structure including a first doped region in a substrate, a first vertical channel extending from the first doped region, a first metal-semiconductor compound region in a top surface of the first doped region, the first metal-semiconductor compound region extending along at least two sides of the first vertical channel, and a first gate electrode around the first vertical channel.

Another embodiment is a semiconductor device including a first source region in a substrate, a first nanobar channel extending from the first source region, the first nanobar channel having sidewalls and a top surface, a first drain region on the top surface of the first nanobar channel, a first metal-semiconductor compound region in a top surface of the first source region, the first metal-semiconductor compound region extending along at least two sidewalls of the first nanobar channel, and a first gate electrode around the sidewalls of first nanobar channel.

A further embodiment is a method including forming a first source/drain region in a substrate, forming a first vertical channel extending from the first source/drain region, forming a first metal-semiconductor compound region in a top surface of the first source/drain region, the first metal-semiconductor compound region extending along at least two sides of the first vertical channel, forming a second source/drain region in top surface of the first vertical channel, and forming a first gate electrode around the first vertical channel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a well in a substrate, the well doped with a first type of dopant;
   a first doped region in the well, the first doped region doped with a second type of dopant different from the first type of dopant, the first doped region having a first longitudinal axis parallel to a major surface of the substrate, the first doped region having a first length along the first longitudinal axis and a first width perpendicular to the first longitudinal axis, the first length greater than the first width;
   a first vertical channel extending from the first doped region;
   a second doped region in the well, the second doped region doped with the second type of dopant, the second doped region having a second longitudinal axis parallel to the first longitudinal axis, the second doped region having a second length along the second longitudinal axis and a second width perpendicular to the second longitudinal axis, the second length greater than the second width, the second length different from the first length;
   a second vertical channel extending from the second doped region, the second vertical channel being adjacent the first vertical channel;
   a first metal-semiconductor compound region physically contacting a top surface of the well, the first metal-semiconductor compound region being a single region extending continuously along and physically contacting at least two sides of the first doped region and at least two sides of the second doped region, the first metal-semiconductor compound region extending between the first doped region and the second doped region;
   a first dielectric layer over the first metal-semiconductor compound region and adjoining the first doped region, the first dielectric layer physically contacting a top surface of the first metal-semiconductor compound region, a sidewall of the first doped region, and a sidewall of the second doped region; and
   a first gate electrode around the first vertical channel, the first gate electrode over the first dielectric layer and the first metal-semiconductor compound region.

2. The structure of claim 1 further comprising:
   a first gate dielectric layer interposed between the first gate electrode and the first vertical channel, the first gate dielectric layer directly adjoining a first sidewall, a second sidewall, a first end, and a second end of the first vertical channel, the first sidewall being opposite the second sidewall, and the first end being opposite the second end.

3. The structure of claim 1 further comprising:
a third doped region in a top surface of the first vertical channel, the top surface of the first vertical channel being distal the substrate.

4. The structure of claim 3, wherein the first doped region is a first source/drain of the first vertical channel, and the third doped region comprises a second source/drain of the first vertical channel.

5. The structure of claim 3 further comprising:
a second metal-semiconductor compound region on a top surface of the third doped region.

6. The structure of claim 5 further comprising:
a second dielectric layer over the first doped region, the first metal-semiconductor compound region, the third doped region, the second metal-semiconductor compound region, and the first gate electrode;
a first contact extending through the second dielectric layer to be electrically and physically coupled to the first metal-semiconductor compound region;
a second contact extending through the second dielectric layer to be electrically and physically coupled to the second metal-semiconductor compound region; and
a third contact extending through the second dielectric layer to be electrically and physically coupled to the first gate electrode.

7. The structure of claim 6, wherein the first contact is directly adjacent a first end of the first vertical channel.

8. The structure of claim 6, wherein the first contact is directly adjacent a first sidewall of the first vertical channel.

9. The structure of claim 1, wherein the first metal-semiconductor compound region surrounds the first vertical channel and the second vertical channel.

10. The structure of claim 1, wherein the first metal-semiconductor compound region extends along two sidewalls and one end of the first vertical channel, wherein the first metal-semiconductor compound region extends along two sidewalls and one end of the second vertical channel.

11. The structure of claim 1 further comprising:
a second gate electrode around the second vertical channel.

12. The structure of claim 11, wherein the first metal-semiconductor compound region continuously surrounds the first vertical channel and the second vertical channel.

13. A semiconductor device comprising:
a well in a substrate, the well doped with a first type of dopant;
a first source region over a top surface of the well, the first source region doped with a second type of dopant different from the first type of dopant;
a first nanobar channel extending from the first source region, the first nanobar channel having sidewalls and a top surface;
a second source region over the top surface of the well, the second source region doped with the second type of dopant;
a second nanobar channel extending from the second source region, the second nanobar channel having sidewalls and a top surface;
a first metal-semiconductor compound region in the top surface of the well, the first metal-semiconductor compound region being a single region extending continuously along at least two of the sidewalls of the first nanobar channel, along at least two of the sidewalls of the second nanobar channel, and between the first nanobar channel and the second nanobar channel; and
a first gate electrode around the sidewalls of the first nanobar channel, the first gate electrode disposed directly over the first metal-semiconductor compound region.

14. The semiconductor device of claim 13, wherein the first nanobar channel has a first longitudinal axis parallel to a major surface of the substrate, the sidewalls of the first nanobar channel including two sides extending parallel to the first longitudinal axis and two ends extending perpendicular to the first longitudinal axis, the first metal-semiconductor compound region being directly adjacent one of the sides and one of the ends.

15. The semiconductor device of claim 14, wherein the first metal-semiconductor compound region is directly adjacent both of the sides and both of the ends of the first nanobar channel, and is directly adjacent both of the sides and both of the ends of the second nanobar channel.

16. The semiconductor device of claim 13 further comprising:
a first drain region on the top surface of the first nanobar channel;
a second drain region on the top surface of the second nanobar channel; and
a second gate electrode around the sidewalls of the second nanobar channel.

17. The semiconductor device of claim 16, wherein the second gate electrode and the first gate electrode are electrically coupled together.

18. The semiconductor device of claim 16, wherein a first portion of the first metal-semiconductor compound region is directly adjacent an end of the first nanobar channel, the first portion having a first width, wherein a second portion of the first metal-semiconductor compound region is directly adjacent an end of the second nanobar channel, the second portion having a second width, the second width being different than the first width.

19. A method comprising:
forming a first well in a substrate, the first well doped with a first type of dopant;
forming a first source/drain region in the first well, the first source/drain region doped with a second type of dopant different from the first type of dopant;
forming a first vertical channel extending from the first source/drain region, the first vertical channel covering portions of the first source/drain region;
forming a second source/drain region in the first well, the second source/drain region doped with the second type of dopant;
forming a second vertical channel extending from the second source/drain region, the second vertical channel covering portions of the second source/drain region;
forming a metal on exposed portions of the first source/drain region and exposed portions of the second source/drain region, the metal being a single region extending continuously along at least two sides of the first vertical channel in a plan view, along at least two sides of the second vertical channel in the plan view, and between the first vertical channel and the second vertical channel;
annealing the metal to form a first metal-semiconductor compound region in a top surface of the first well, the annealing consuming all of the exposed portions of the first source/drain region such that the first metal-semiconductor compound region extends to a top surface of the first well;

forming a first gate electrode around the first vertical channel; and forming a second gate electrode around the second vertical channel.

20. The method of claim 19, wherein the first metal-semiconductor compound region surrounds the first vertical channel and the second vertical channel.

* * * * *